(12) United States Patent
Kikuchi et al.

(10) Patent No.: US 12,395,167 B2
(45) Date of Patent: *Aug. 19, 2025

(54) SIGNAL TRANSMISSION DEVICE, ELECTRONIC DEVICE AND VEHICLE

(71) Applicant: Rohm Co., Ltd., Kyoto (JP)

(72) Inventors: Takeshi Kikuchi, Kyoto (JP); Masato Nishinouchi, Kyoto (JP); Akio Sasabe, Kyoto (JP); Daiki Yanagishima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/673,151

(22) Filed: May 23, 2024

(65) Prior Publication Data

US 2024/0322816 A1  Sep. 26, 2024

Related U.S. Application Data

(63) Continuation of application No. 18/024,086, filed as application No. PCT/JP2021/034072 on Sep. 16, 2021.

(30) Foreign Application Priority Data

Sep. 29, 2020 (JP) .................................. 2020-163734

(51) Int. Cl.
*H02P 29/024* (2016.01)
*H03K 17/18* (2006.01)

(52) U.S. Cl.
CPC ......... *H03K 17/18* (2013.01); *H02P 29/0241* (2016.02)

(58) Field of Classification Search
CPC .... H02P 29/024; H02P 29/0241; H03K 17/18

(Continued)

(56) References Cited

U.S. PATENT DOCUMENTS 5,900,683 A * 5/1999 Rinehart .............. H03K 17/567
307/129
8,054,654 B2 * 11/2011 Kato .................... H03K 17/567
363/21.04

(Continued)

FOREIGN PATENT DOCUMENTS

| JP | 2018-011108 | 1/2018 |
| WO | WO 2011/055611 | 5/2011 |
| WO | WO 2014/147882 | 9/2014 |

OTHER PUBLICATIONS

International Search Report in International Appln. No. PCT/JP2021/034072, mailed on Oct. 12, 2021, 4 pages (with machine translation).

(Continued)

*Primary Examiner* — William Hernandez
(74) *Attorney, Agent, or Firm* — Fish & Richardson P.C.

(57) ABSTRACT

A signal transmission device that transmits a driving signal for a power transistor from a primary circuit system to a secondary circuit system while isolating between the primary and secondary circuit systems includes: a first fault detection circuit configured to detect a fault in the primary circuit system; a second fault detection circuit configured to detect a fault in the secondary circuit system; a first signal transmission path configured to transmit the result of detection by the second fault detection circuit from the secondary circuit system to the primary circuit system while isolating between the primary and secondary circuit systems; and a self-test circuit configured to perform a self-test on each of the first fault detection circuit, the second fault detection circuit, and the first signal transmission path.

20 Claims, 21 Drawing Sheets

(58) Field of Classification Search
USPC .................................. 307/9.1, 10.1, 104, 130
See application file for complete search history.

(56) References Cited

U.S. PATENT DOCUMENTS

| | | |
|---|---|---|
| 9,502,954 B2 | 11/2016 | Morokuma et al. |
| 9,673,809 B1 | 6/2017 | Kandah et al. |
| 10,784,857 B1 | 9/2020 | Li et al. |
| 11,581,840 B2* | 2/2023 | Kirby .................. H02H 7/0822 |
| 12,034,437 B2 | 7/2024 | Kikuchi et al. |
| 2012/0212251 A1 | 8/2012 | Yanagishima et al. |
| 2015/0137843 A1 | 5/2015 | Yanagishima et al. |
| 2016/0020686 A1 | 1/2016 | Morokuma et al. |
| 2017/0194959 A1 | 7/2017 | Yanagishima et al. |
| 2019/0334522 A1 | 10/2019 | Yanagishima et al. |
| 2020/0096574 A1* | 3/2020 | Li ........................ H03K 17/081 |
| 2020/0313671 A9 | 10/2020 | Yanagishima et al. |
| 2020/0350905 A1* | 11/2020 | Bang ................ H03K 17/08122 |
| 2021/0351772 A1 | 11/2021 | Yanagishima et al. |
| 2023/0253963 A1 | 8/2023 | Yanagishima et al. |
| 2023/0327662 A1 | 10/2023 | Kikuchi et al. |

OTHER PUBLICATIONS

JP OA—Japanese Patent Office, Office Action in Japanese Appln. No. 2022-553811, dated Apr. 15, 2025, 12 pages (with English translation).

* cited by examiner

SIGNAL TRANSMISSION DEVICE, ELECTRONIC DEVICE AND VEHICLE

CROSS-REFERENCE TO RELATED APPLICATIONS

This application is a continuation of U.S. patent application Ser. No. 18/024,086 filed Mar. 1, 2023, which claims the benefit of International Application No. PCT/JP2021/034072, filed on Sep. 16, 2021, which claims the benefit of priority from Japanese Patent Application No. 2020-163734, filed Sep. 29, 2020, the entire contents of which are incorporated herein by reference.

TECHNICAL FIELD

The invention disclosed herein relates to signal transmission devices, and to electronic devices and vehicles that incorporate signal transmission devices.

BACKGROUND ART

Conventionally, signal transmission devices that transmit a signal between a primary circuit system and a secondary circuit system while electrically isolating between the primary and secondary circuit systems are used in various applications (such as power supply devices and motor driving devices).

One example of the known technology mentioned above is seen in Patent Document 1 identified below by the present applicant.

CITATION LIST

Patent Literature

Patent Document 1: JP-A-2018-011108

SUMMARY OF INVENTION

Technical Problem

Inconveniently, conventional signal transmission devices leave room for improvement in their self-test function.

Solution to Problem

In view of the above-mentioned challenge encountered by the present inventors, an object of the invention disclosed herein is to provide a signal transmission device that can perform a self-test appropriately, and to provide an electronic device and a vehicle that employ such a signal transmission device.

For example, according to what is disclosed herein, a signal transmission device that transmits a driving signal for a power transistor from a primary circuit system to a secondary circuit system while isolating between the primary and secondary circuit systems includes: a first fault detection circuit configured to detect a fault in the primary circuit system; a second fault detection circuit configured to detect a fault in the secondary circuit system; a first signal transmission path configured to transmit the result of detection by the second fault detection circuit from the secondary circuit system to the primary circuit system while isolating between the primary and secondary circuit systems; and a self-test circuit configured to perform a self-test on each of the first fault detection circuit, the second fault detection circuit, and the first signal transmission path.

Advantageous Effects of Invention

According to the invention disclosed herein, it is possible to provide a signal transmission device that can perform a self-test appropriately, and to provide an electronic device and a vehicle that employ such a signal transmission device.

DESCRIPTION OF EMBODIMENTS

<Signal Transmission Device (Basic Configuration)>

Figure 1:
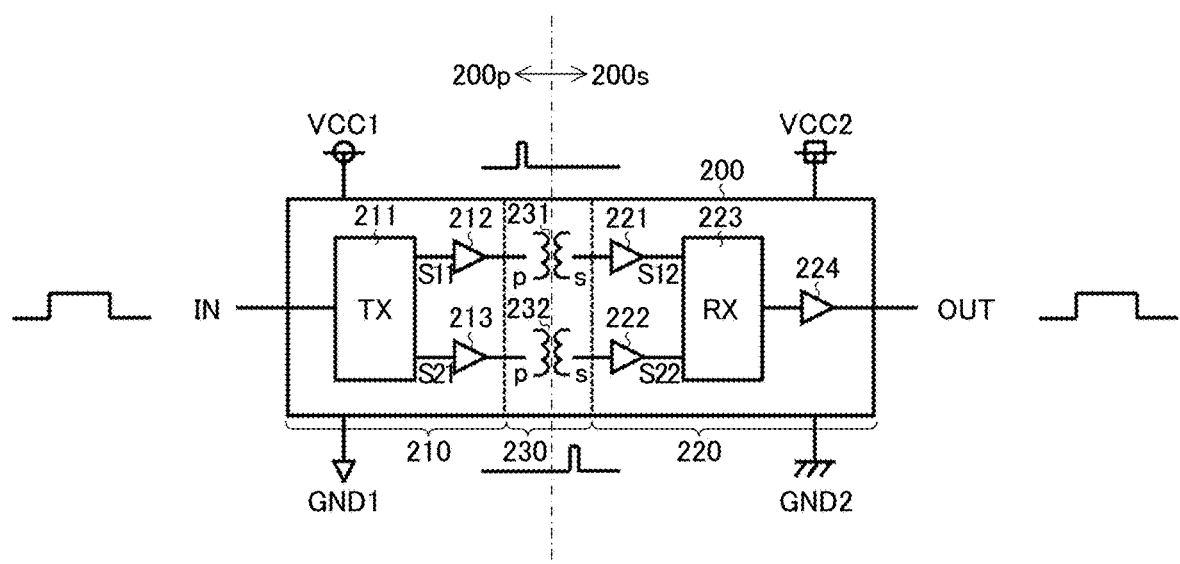
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200*p* (VCC1-GND1 system) and a secondary circuit system 200*s* (VCC2-GND2 system), transmits a pulse signal from the primary circuit system 200*p* to the secondary circuit system 200*s* to drive the gate of a switching device (unillustrated) provided in the secondary circuit system 200*s*. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231*p*, the reception pulse signal S12 from the secondary coil 231*s*. Likewise, the transformer 232 outputs, according to the transmission pulse signal S21 fed to the primary coil 232*p*, the reception pulse signal S22 from the secondary coil 232*s*.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200*p* to the secondary circuit system 200*s*.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
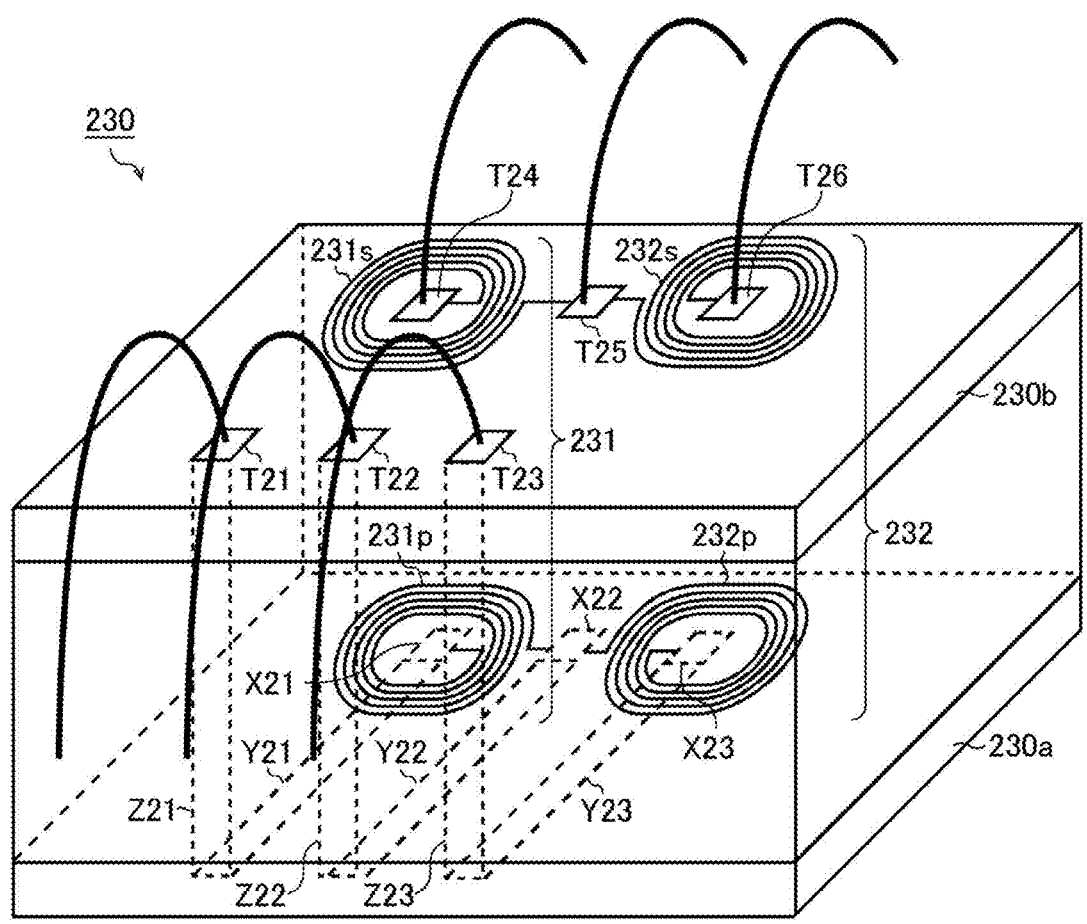
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231*p* and a secondary coil 231*s* that face each other in the up-down direction; the transformer 232 includes a primary coil 232*p* and a secondary coil 232*s* that face each other in the up-down direction.

The primary coils 231*p* and 232*p* are both formed in a first wiring layer (lower layer) 230*a* in the transformer chip 230. The secondary coils 231*s* and 231*s* are both formed in a second wiring layer (the upper layer in the diagram) 230*b* in the transformer chip 230. The secondary coil 231*s* is disposed right above the primary coil 231*p* and faces the primary coil 231*p*; the secondary coil 232*s* is disposed right above the primary coil 232*p* and faces the primary coil 232*p*.

The primary coil 231*p* is laid in a spiral shape so as to encircle an internal terminal X21 clockwise, starting at the first terminal of the primary coil 231*p*, which is connected to the internal terminal X21. The second terminal of the primary coil 231*p*, which corresponds to its end point, is connected to an internal terminal X22. Likewise, the primary coil 232*p* is laid in a spiral shape so as to encircle an internal terminal X23 anticlockwise, starting at the first terminal of the primary coil 232*p*, which is connected to the internal terminal X23. The second terminal of the primary coil 232*p*, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230b. The internal terminal X22 is connected, via a wiring Y22 and a via Z22 both conductive, to an external terminal T22 in the second layer 230b. The internal terminal X23 is connected, via a wiring Y23 and a via Z23 both conductive, to an external terminal T23 in the second layer 230b. The external terminals T21 to T23 are disposed in a straight row and are used for wire-bonding with the controller chip 210.

The secondary coil 231s is laid in a spiral shape so as to encircle an external terminal T24 anticlockwise, starting at the first terminal of the secondary coil 231s, which is connected to the external terminal T24. The second terminal of the secondary coil 231s, which corresponds to its end point, is connected to an external terminal T25. Likewise, the secondary coil 232s is laid in a spiral shape so as to encircle an external terminal T26 clockwise, starting at the first terminal of the secondary coil 232s, which is connected to the external terminal T26. The second terminal of the secondary coil 232s, which corresponds to its end point, is connected to the external terminal T25. The external terminals T24, T25, and T26 are disposed in a straight row in the illustrated order and are used for wire-bonding with the driver chip 220.

The secondary coils 231s and 232s are AC-connected to the primary coils 231p and 232p, respectively, by magnetic coupling, and are DC-isolated from the primary coils 231p and 232p. That is, the driver chip 220 is AC-connected to the controller chip 210 via the transformer chip 230, and is DC-isolated from the controller chip 210 by the transformer chip 230.

<Transformer Chip (Two-Channel Type)>

Figure 3:
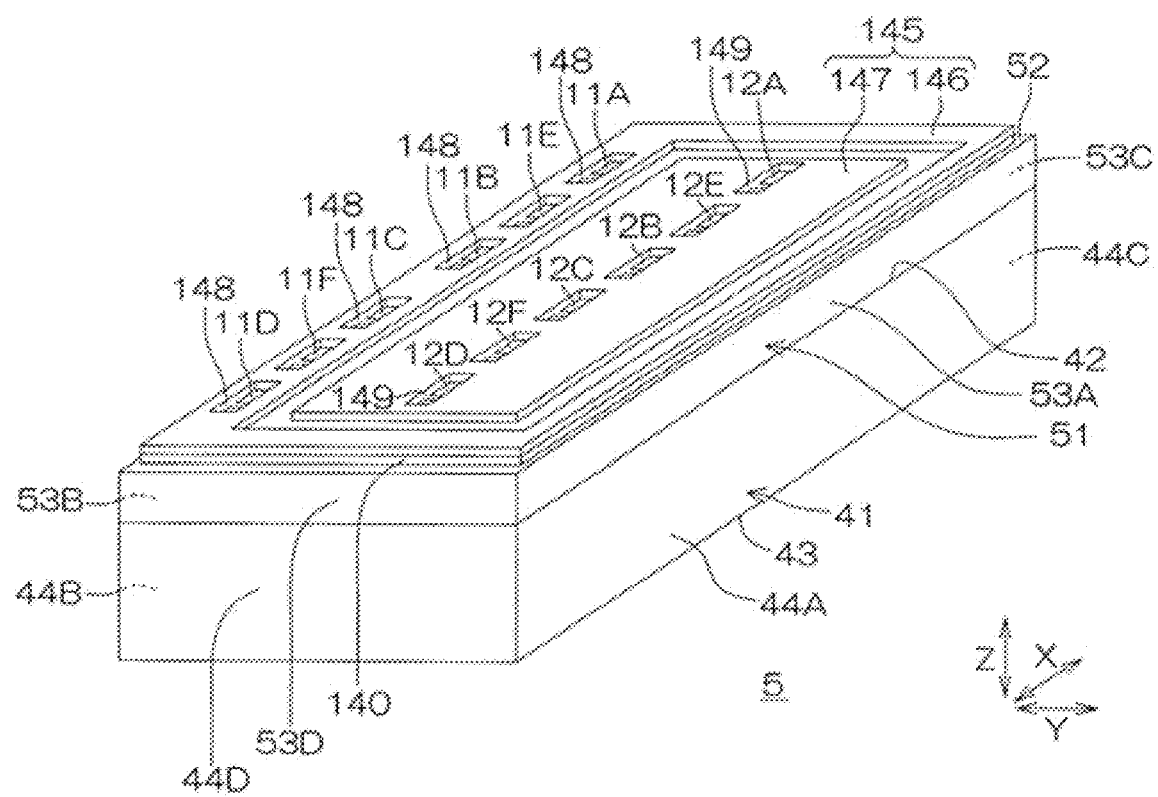
FIG. 3 a perspective view of a semiconductor device used as a two-channel transformer chip.
Figure 4:
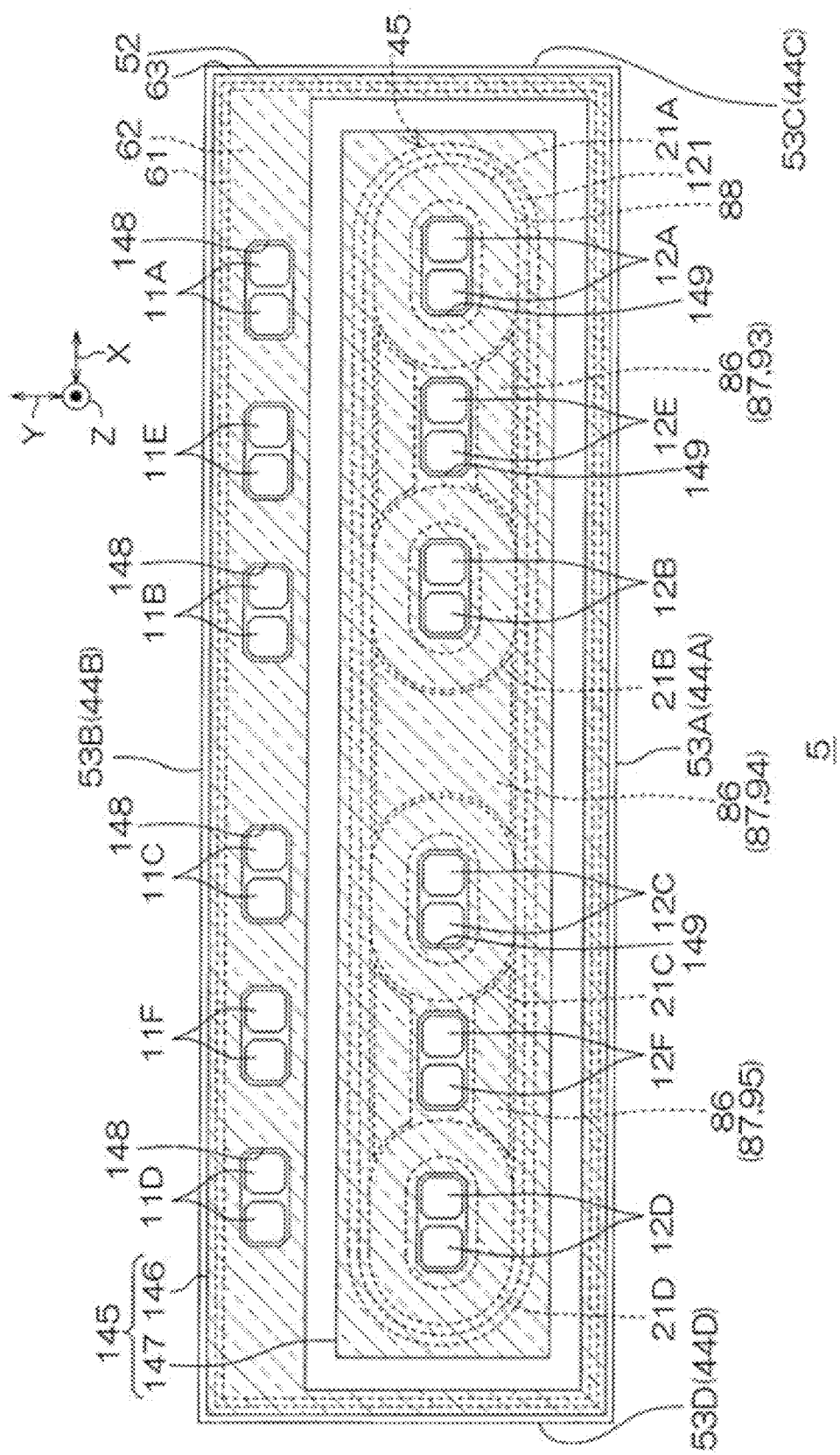
FIG. 4 is a plan view of the semiconductor device shown in FIG. 3.
Figure 5:
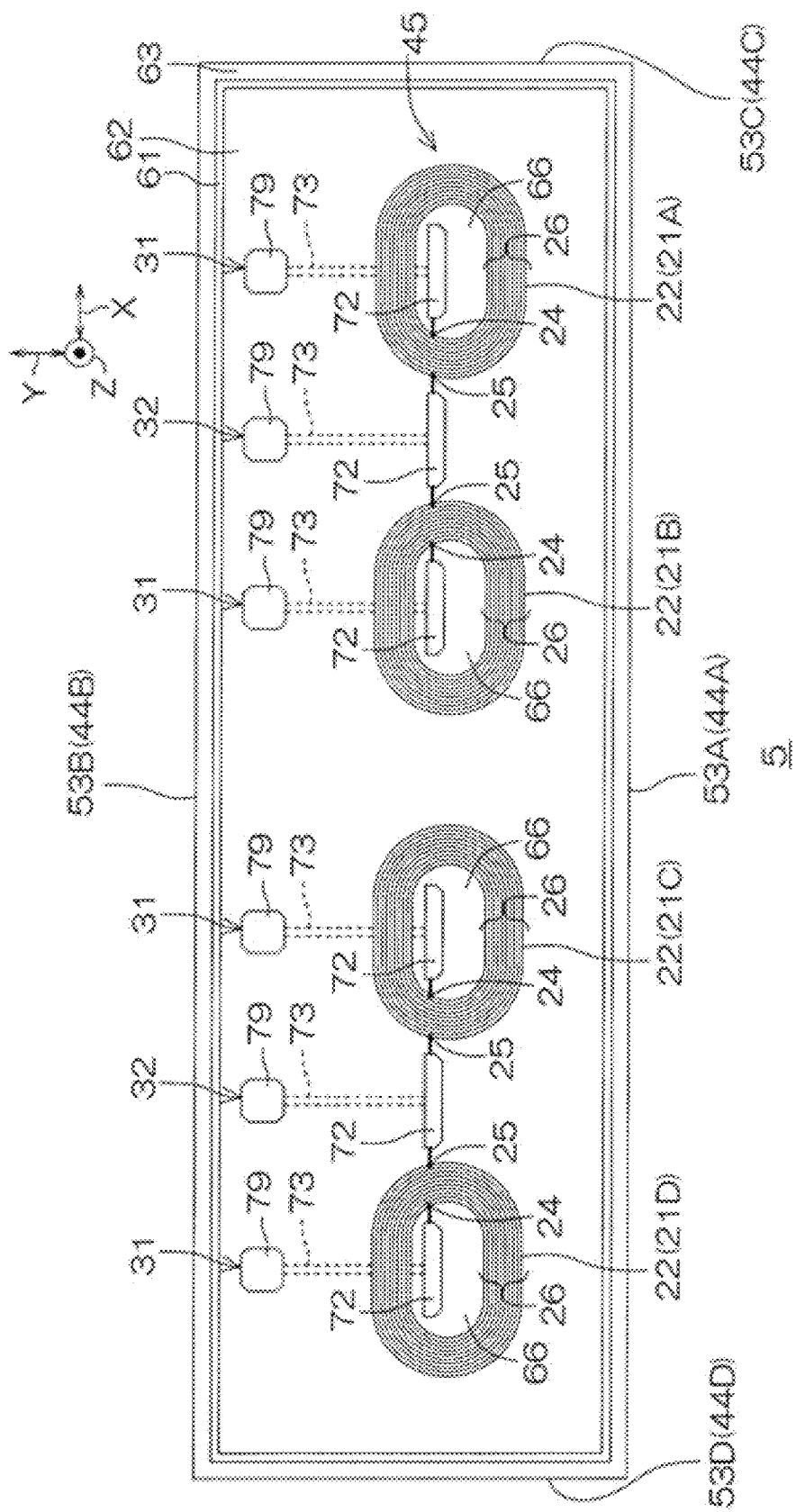
FIG. 5 is a plan view of a layer in the semiconductor device shown in FIG. 3 where low-potential coils are formed.
Figure 6:
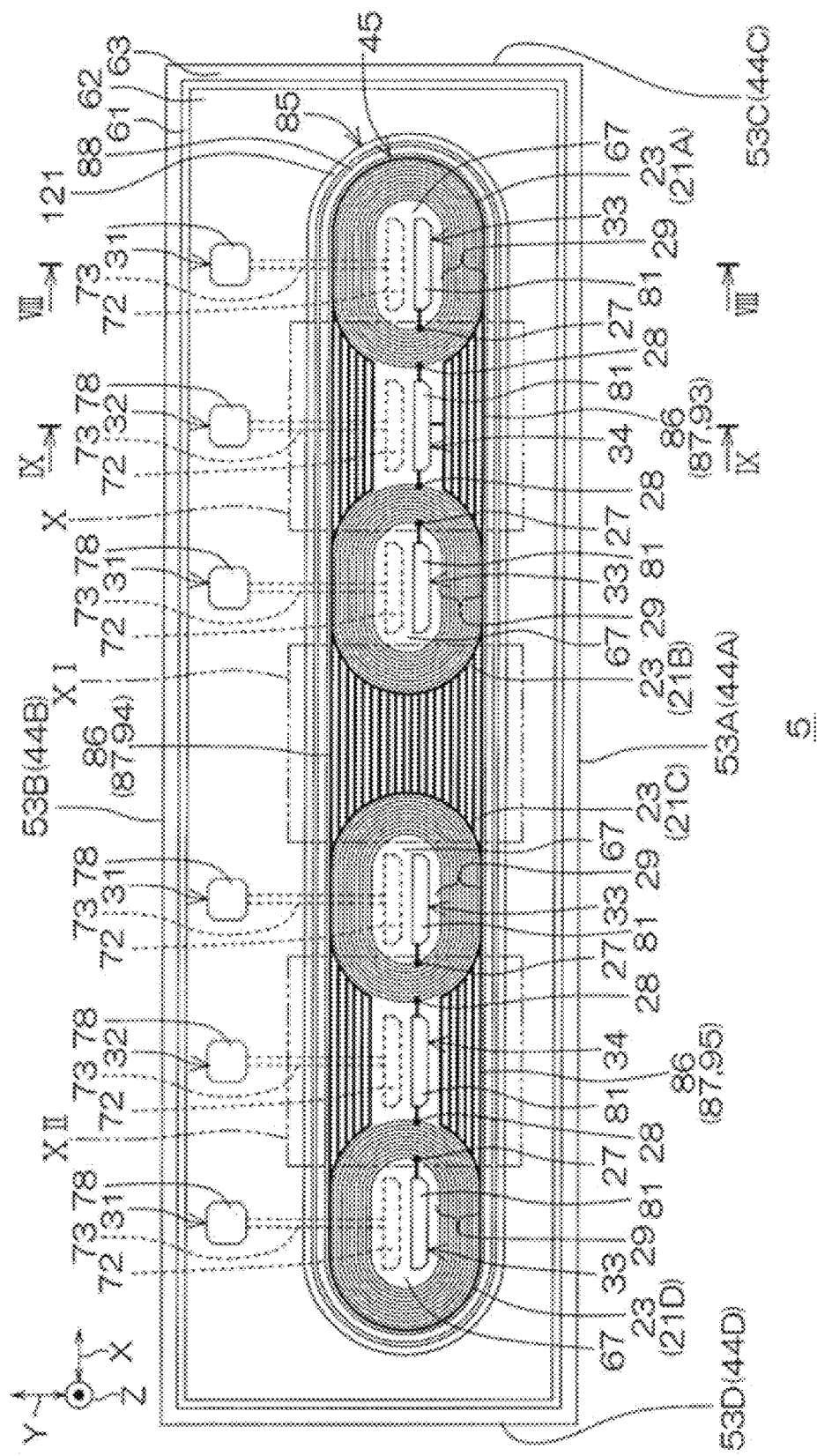
FIG. 6 is a plan view of a layer in the semiconductor device shown in FIG. 3 where high-potential coils are formed.
Figure 7:
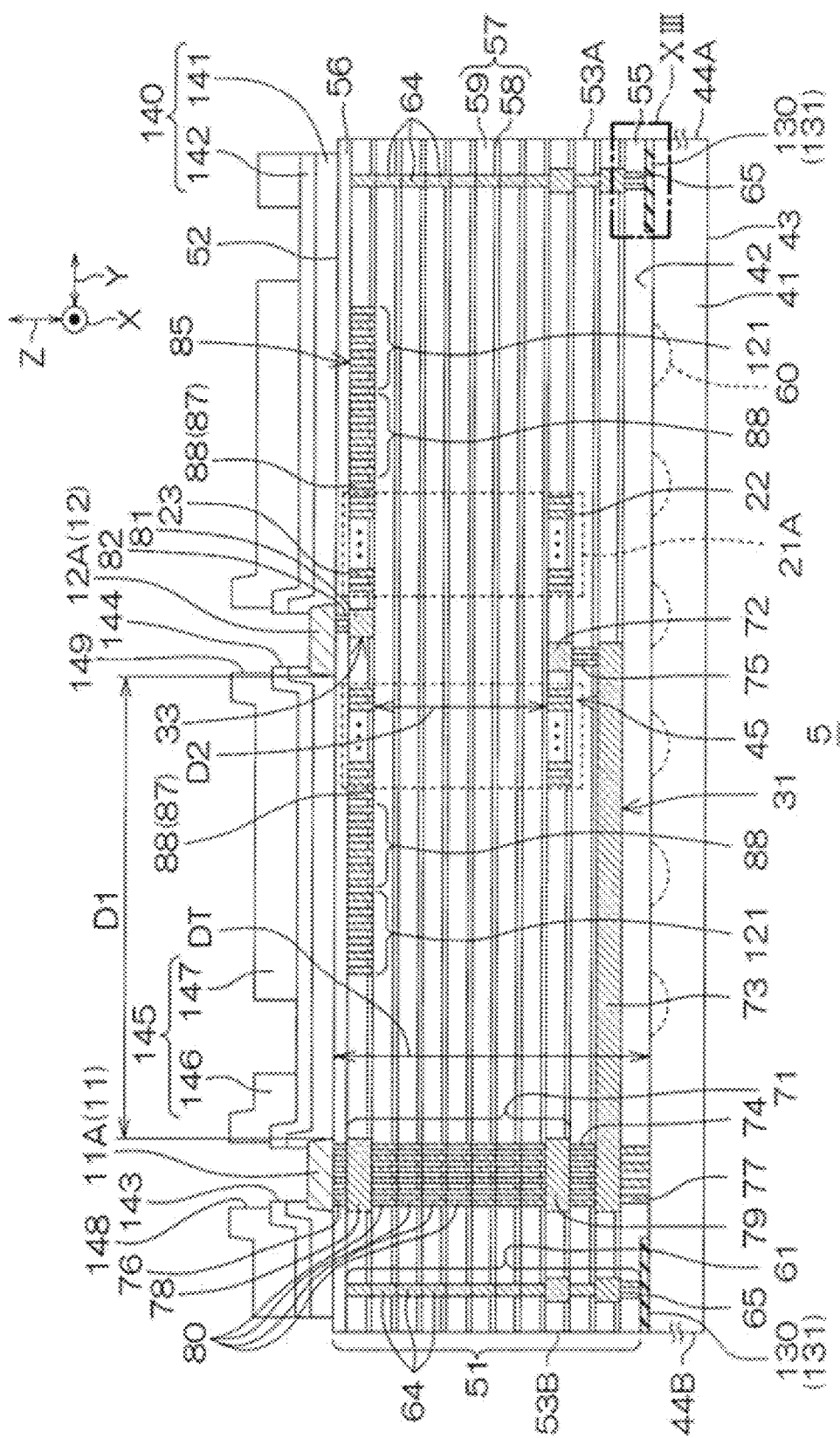
FIG. 7 is a cross-sectional view taken along line VIII-VIII shown in FIG. 6.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multi-layer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 µm or more but 3 µm or less (e.g., about 2 µm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 µm or more but 1 µm or less (e.g., about 0.3 µm).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 μm or less (e.g., about 2 μm). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding to the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but 5 μm or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIGS. 6 and 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 50 μm or less. Preferably, the distance D2 is 5 μm or more but 25 μm or less. The distances D1 and D2 can have any values, which are adjusted appropriately according to the desired dielectric strength voltage.

Referring to FIGS. 6 and 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating dummy patterns.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 5 to 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Figure 8:
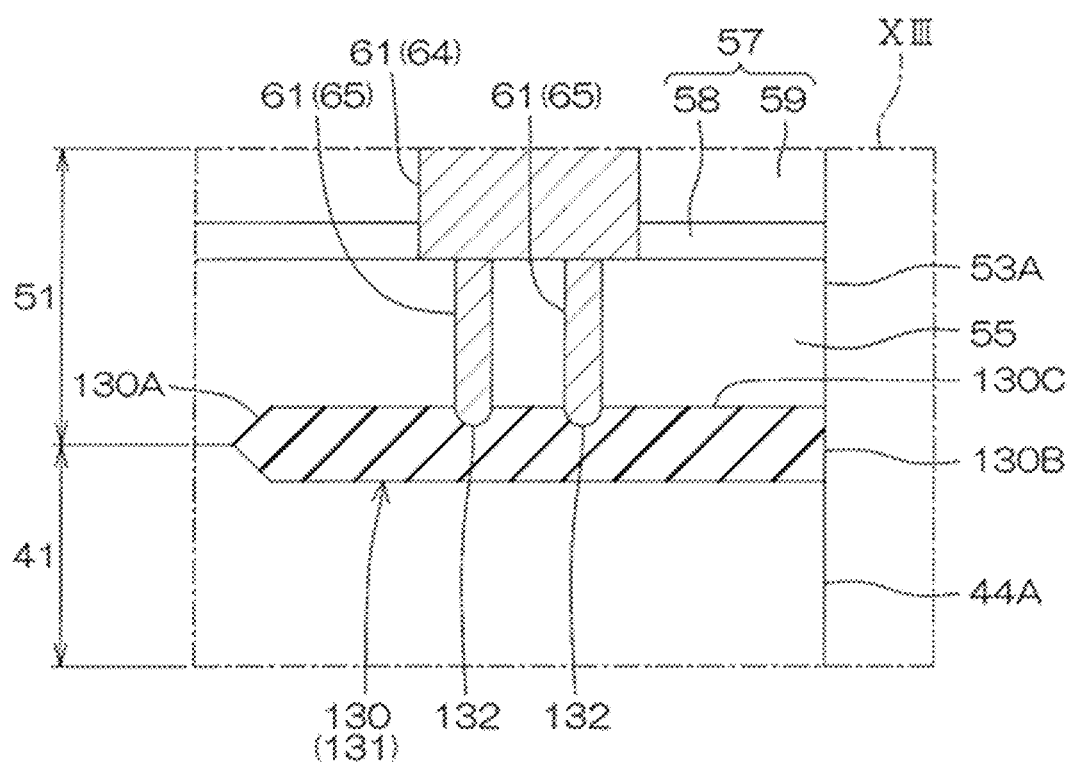
FIG. 8 is an enlarged view (showing a separation structure) of region XIII shown in FIG. 7.

Referring to FIGS. 7 and 8, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 μm or more but 50 μm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 μm or more but 10 μm or less. Preferably, the organic insulation layer 145 has a thickness of 5 μm or more but 50 μm or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present invention can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 9:
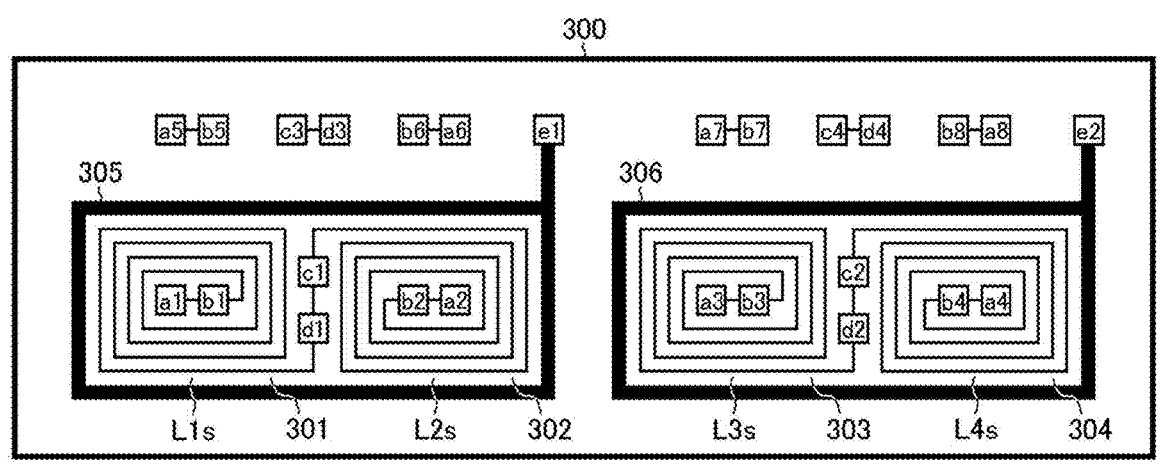
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1s of the first transformer 301, and the pads c1 and d1 are connected to the other terminal of that secondary coil L1s. The pads a2 and b2 are connected to one terminal of the secondary coil L2s of the second transformer 302, and the pads c1 and d1 are connected to the other terminal of that secondary coil L2s.

Moreover, the pads a3 and b3 are connected to one terminal of the secondary coil L3s of the third transformer 303, and the pads c2 and d2 are connected to the other terminal of that secondary coil L3s. The pads a4 and b4 are connected to one terminal of the secondary coil L4s of the fourth transformer 304, and the pads c2 and d2 are connected to the other terminal of that secondary coil L4s.

FIG. 9 does not show any of the primary coils of the first, second, third, and fourth transformers 301, 302, 303, and 304. The primary coils basically have structures similar to those of the secondary coils L1s to L4s respectively, and are disposed right below the secondary coils L1s to L4s, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1s and L2s. The pads c2 and d2 are shared between the secondary coils L3s and L4s. The pads c3 and d3 are shared between the primary coils L1p and L2p. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

<Signal Transmission Device (Embodiment)>

Figure 10:
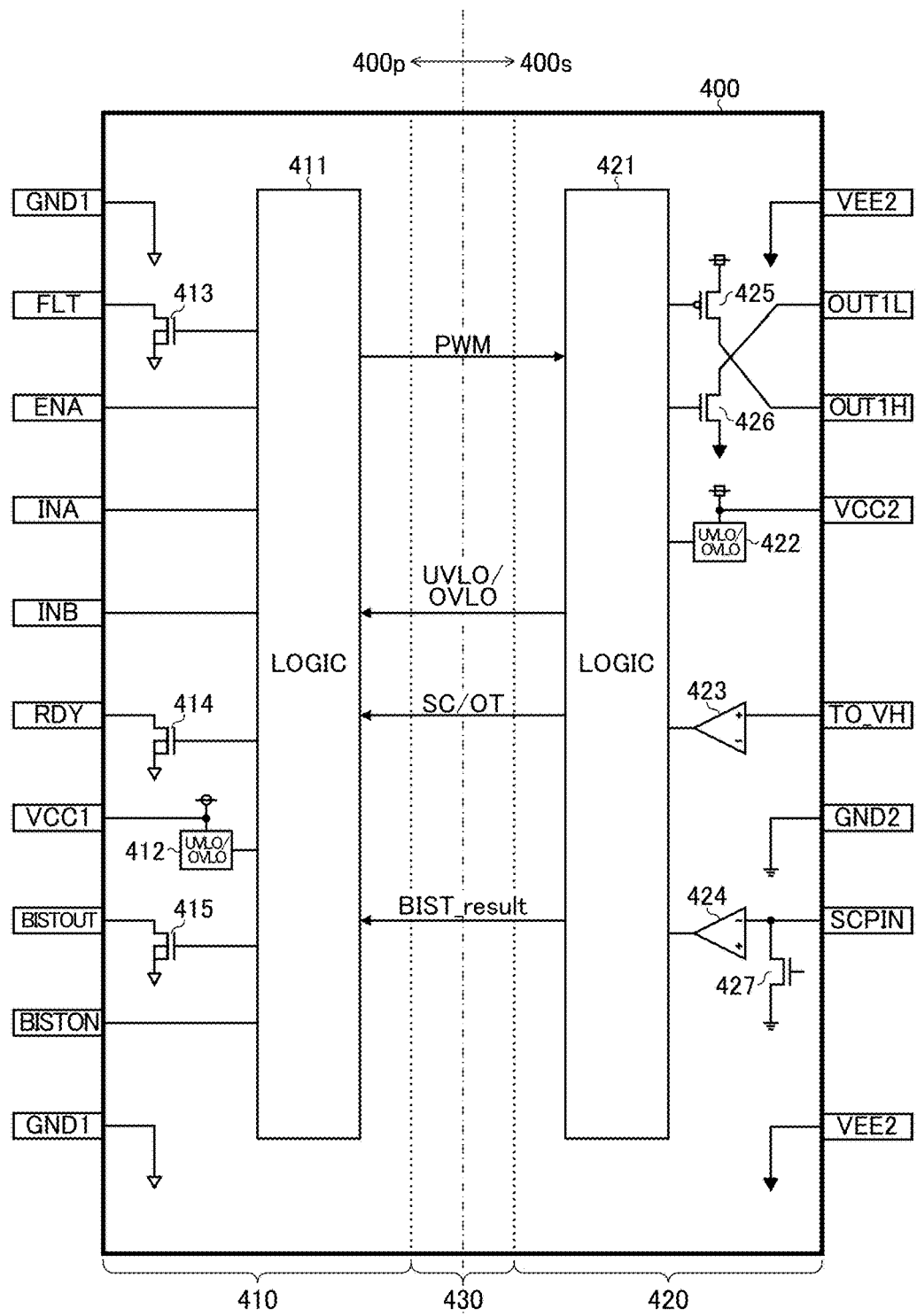
FIG. 10 is a diagram showing a signal transmission device according to an embodiment.

FIG. 10 is a diagram showing a signal transmission device according to an embodiment. The signal transmission device 400 of this embodiment is a semiconductor integrated circuit device (what is generally called an isolated gate driver IC) that, while isolating between a primary circuit system 400p (VCC1-GND1 system) and a secondary circuit system 400s (VCC2-GND2 system), transmits a pulse signal from the primary circuit system 400p to the secondary circuit system 400s to drive the gate of a power transistor (unillustrated)

provided in the secondary circuit system 400s. The signal transmission device 400 can be understood as corresponding to the signal transmission device 200 described previously.

The signal transmission device 400 has, as a means for establishing electrical connection with outside it, a plurality of external terminals (of which the diagram shows power terminals VCC1 and VCC2, ground terminals GND1 and GND2, a negative power terminal VEE2, input terminals INA and INB, output terminals OUT1H and OUT1L, a fault terminal FLT, a ready terminal RDY, an enable terminal ENA, an overheat/load power fault detection terminal TO_VH, a short detection terminal SCPIN, a self-test on terminal BISTON, and a self-test output terminal BISTOUT).

Along a first side (the left side in the diagram) of the package of the signal transmission device 400 are disposed, from top down, the ground terminal GND1, the fault terminal FLT, the enable terminal ENA, the input terminal INA, the input terminal INB, the ready terminal RDY, the power terminal VCC1, the self-test output terminal BISTOUT, the self-test on terminal BISTON, and the ground terminal GND1.

On the other hand, along a second side (the side opposite from the first side mentioned above, i.e., the right side in the diagram) of the package are disposed, from top down, the negative power terminal VEE2, the output terminal OUT1L, the output terminal OUT1H, the power terminal VCC2, the overheat/load power fault detection terminal TO_VH, the ground terminal GND2, the short detection terminal SCPIN, and the negative power terminal VEE2.

In this way, the external terminals for the primary circuit system 400p (i.e., GND1, FLT, ENA, INA and INB, RDY, VCC1, BISTOUT, and BISTON) can be arranged together along the first side of the package, and the external terminals for the secondary circuit system 400s (i.e., VEE2, OUT1L, OUT1H, VCC2, VO_VH, GND2, and SCPIN) can be arranged together along the second side of the package.

The ground terminal GND1 and the negative power terminal VEE2 can each be disposed at either end of the corresponding one of the first and second sides of the package. That is, two each of the ground terminals GND1 and the negative power terminals VEE2 can be provided.

The signal transmission device 400 can be employed widely in applications in general that require signal transmission between a primary circuit system 400p and a secondary circuit system 400s while isolating between them (such as motor drivers and DC/DC converters that handle high voltages).

Referring still to FIG. 10, the internal configuration of the signal transmission device 400 will be described. The signal transmission device 400 of this configuration example has a controller chip 410 (corresponding to a first chip), a driver chip 420 (corresponding to a second chip), and a transformer chip 430 (corresponding to a third chip) sealed in a single package.

The controller chip 410 is a semiconductor chip having integrated in it the circuit elements of the primary circuit system 400p that operate by being supplied with a supply voltage VCC1 (e.g., seven volts at the maximum with respect to GND1). The controller chip 410 has integrated in it, for example, a logic circuit 411, an UVLO (undervoltage lock-out)/OVLO (overvoltage lock-out) circuit 412, and NMOSFETs 413 to 415.

The logic circuit 411 generates a driving pulse signal PWM for a power transistor (unillustrated) according to input pulse signals INA and INB. For example, when INB=H (the logic level indicating a disabled state), PWM=L (fixed value); when INB=L (the logic level indicating an enabled state), PWM=INA. The logic circuit 411 also has a function of monitoring various fault detection signals (such as undervoltage, overvoltage, short-circuit, open-circuit, overheat, and load power fault) and driving the NMOSFETs 413 and 414 according to the results of the monitoring to determine the logic levels of the fault signal FLT and the ready signal RDY. The logic circuit 411 also has a function of switching, according to an enable signal ENA, whether to permit the entire signal transmission device 400 to operate (whether to enable or disable it).

The logic circuit 411 further has a function of performing a self-test (what is generally called a BIST [built-in self test]) on different parts of the signal transmission device 400 according to a self-test on signal BISTON and driving the NMOSFET 415 according to the results of the self-test to determine the logic level of a self-test output signal BISTOUT. That is, the logic circuit 411 functions as part of a self-test circuit built in the signal transmission device 400 (details will be given later).

The UVLO/OVLO circuit 412 detects an undervoltage/overvoltage in the supply voltage VCC1, and outputs the result of the detection to the logic circuit 411.

The NMOSFET 413 switches the path between the fault terminal FLT and a ground terminal between a conducting state and a cut-off state according to instructions from the logic circuit 411. For example, when an overheat or load power fault is detected in the driver chip 420, the NMOSFET 413 turns on and thus the fault terminal FLT turns to low level (the logic level indicating a fault being detected).

The NMOSFET 414 switches the path between the ready terminal RDY and the ground terminal between a conducting state and a cut-off state according to instructions from the logic circuit 411. For example, when an undervoltage or overvoltage is detected in either the controller chip 410 or the driver chip 420, the NMOSFET 414 turns on and thus the ready terminal RDY turns to low level (the logic level indicating a fault being detected).

The NMOSFET 415 switches the path between the self-test output terminal BISTOUT and the ground terminal between a conducting state and a cut-off state according to instructions from the logic circuit 411. For example, when the result of the self-test in the signal transmission device 400 is NG, the NMOSFET 415 turns on and thus the self-test output terminal BISTOUT turns to low level (the logic level indicating a fault being detected).

The driver chip 420 is a semiconductor chip having integrated in it the circuit elements of the secondary circuit system 400s that operate by being supplied with a supply voltage VCC2 (e.g., 30 volts at the maximum with respect to GND2). The driver chip 420 has integrated in it, for example, a logic circuit 421, an UVLO/OVLO circuit 422, comparators 423 and 424, a PMOSFET 425, and NMOSFETs 426 and 427.

The logic circuit 421 turns on and off the PMOSFET 425 and the NMOSFET 426 according to the driving pulse signal PWM fed to the logic circuit 421 via the transformer chip 430, and thereby drives the gates of power transistors (unillustrated) connected to the output terminals OUT1H and OUT1L. The output terminals OUT1H and OUT1L can be short-circuited to each other outside the signal transmission device 400. The logic circuit 421 also has a function of transmitting various fault detection signals (such as undervoltage, overvoltage, short-circuit, open-circuit, overheat, and load power fault) from the driver chip 420 to the controller chip 410 via the transformer chip 430.

The logic circuit 421 further has a function of transmitting a self-test result (BIST_result) from the driver chip 420 to the controller chip 410 via the transformer chip 430. That is, the logic circuit 421 functions as part of a self-test circuit built in the signal transmission device 400 (details will be given later).

The UVLO/OVLO circuit 422 detects an undervoltage/overvoltage in the supply voltage VCC2, and outputs the result of the detection to the logic circuit 421.

The comparator 423 monitors the terminal voltage at the overheat/load power fault detection terminal TO_VH, and thereby checks for overheating in the power transistors or an overvoltage in a load supply voltage.

The comparator 424 monitors the terminal voltage at the short detection terminal SCPIN, and thereby checks for a short circuit in the power transistors (checks for a through current across high- and low-side power transistors).

The PMOSFET 425 switches the path between a power terminal and the output terminal OUT1H between a conducting state and a cut-off state according to instructions from the logic circuit 421. For example, when the driving pulse signal PWM is at high level, the PMOSFET 425 is on, and thus the output terminal OUT1H (hence the output pulse signal applied to the gate of the power transistor) is at high level.

The PMOSFET 426 switches the path between the output terminal OUT1L and a ground terminal between a conducting state and a cut-off state according to instructions from the logic circuit 421. For example, when the driving pulse signal PWM is at low level, the PMOSFET 426 is on, and thus the output terminal OUT1L (hence the output pulse signal applied to the gate of the power transistor) is at low level.

Thus, the PMOSFET 425 and the NMOSFET 426 function as a half-bridge output stage (CMOS [complementary MOS] inverter stage) for gate driving.

The NMOSFET 427 switches the path between the ground terminal GND2 and the short detection terminal SCPIN between a conducting state and a cut-off state according to instructions from the logic circuit 421. For example, when OUT1H=H, the NMOSFET 427 is off and, when OUT1H=L, the NMOSFET 427 is on. The NMOSFET 427 turns on and off complementarily with the power transistors (not illustrated), and thereby functions as a discharge switch for discharging a capacitor (unillustrated) externally connected between SCPIN and GND2.

The transformer chip 430 is a semiconductor chip having integrated in it a transformer for signal transmission between the controller chip 410 and the driver chip 420 while isolating between them.

The signal transmission device 400 of this configuration example has, separately from the controller chip 410 and the driver chip 420, the transformer chip 430 that incorporates a transformer alone, and these three chips are sealed in a single package.

With this configuration, the controller chip 410 and the driver chip 420 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

Moreover, the controller chip 410 and the driver chip 420 can each be fabricated by a time-proven existing process. This eliminates the need for conducting reliability tests anew, and contributes to a shortened development period and reduced development costs.

Moreover, use of a DC isolating element other than a transformer (e.g., a photocoupler) can be coped with easily by solely mounting the alternative in place of the transformer chip 430. This eliminates the need for re-developing the controller chip 410 and the driver chip 420, and contributes to a shortened development period and reduced development costs.

<Electronic Device>

Figure 11:
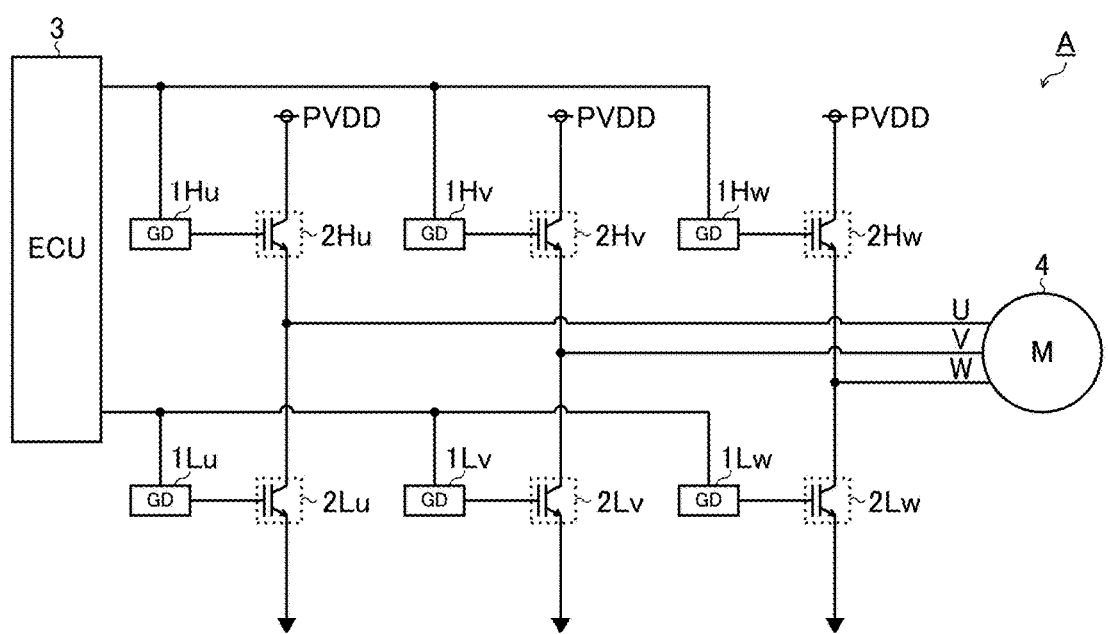
FIG. 11 is a diagram showing one configuration example of an electronic device that incorporates a signal transmission device.

FIG. 11 is a diagram showing one configuration example of an electronic device that incorporates the signal transmission device 400. The electronic device A of this configuration example includes high-side gate driver ICs 1H(u/v/w), low-side gate driver ICs 1L(u/v/w), high-side power transistors 2H(u/v/w), low-side power transistors 2L(u/v/w), an ECU 3, and a motor 4.

The high-side gate driver ICs 1H(u/v/w), while isolating between the ECU 3 and the high-side power transistors 2H(u/v/w) respectively, generate high-side gate driving signals according to high-side gate control signals fed from the ECU 3, and thereby drive the high-side power transistors 2H(u/v/w).

The low-side gate driver ICs 1L(u/v/w), while isolating between the ECU 3 and the low-side power transistors 2L(u/v/w) respectively, generate low-side gate driving signals according to low-side gate control signals fed from the ECU 3, and thereby drive the low-side power transistors 2L(u/v/w).

As each of the high- and low-side gate driver ICs 1H(u/v/w) and 1L(u/v/w) mentioned above, the signal transmission device 400 described previously can be suitably used.

The high-side power transistors 2H(u/v/w) are each connected, as a high-side switch in a half-bridge output stage for one of three phases (U/V/W phases) respectively, between a power-system power terminal (i.e., an application terminal for a load supply voltage PVDD) and the input terminal of the motor 4 for the corresponding phase.

The low-side power transistors 2L(u/v/w) are each connected, as a low-side switch in a half-bridge output stage for one of three phases (U phase/V phase/W phase) respectively, between the input terminal of the motor 4 for the corresponding phase and a power-system ground terminal.

In the diagram, the high- and low-side power transistors 2H(u/v/w) and 2L(u/v/w) are implemented as IGBTs (insulated-gate bipolar transistors) respectively. Instead of IGBTs, MOSFETs (metal-oxide-semiconductor field-effect transistors) may be used.

The ECU 3 drives the high- and low-side power transistors 2H(u/v/w) and 2L(u/v/w) via the high- and low-side gate driver ICs 1H(u/v/w) and 1L(u/v/w) respectively, and thereby controls the driving of the rotation of the motor 4. The ECU 3 also has a function of monitoring the fault terminal FLT and the ready terminal RDY of each of the high- and low-side gate driver ICs 1H(u/v/w) and 1L(u/v/w) and performing various kinds of safety control based on the results of the monitoring.

The ECU 3 further has a function of acquiring, by using the self-test on signal BISTON, the result of a self-test in the signal transmission device 400 and a function of checking, based on the logic level of the self-test output signal BISTOUT, whether different protection circuits (for undervoltage, overvoltage, overheat, and short-circuit protection) in the signal transmission device 400 are operating normally.

The motor 4 is a three-phase motor that is driven to rotate according to three-phase driving voltages U/V/W fed from the half-bridge output stages for three phases (U/V/W phases) respectively.

<Self-Test Circuit>

Figure 12:
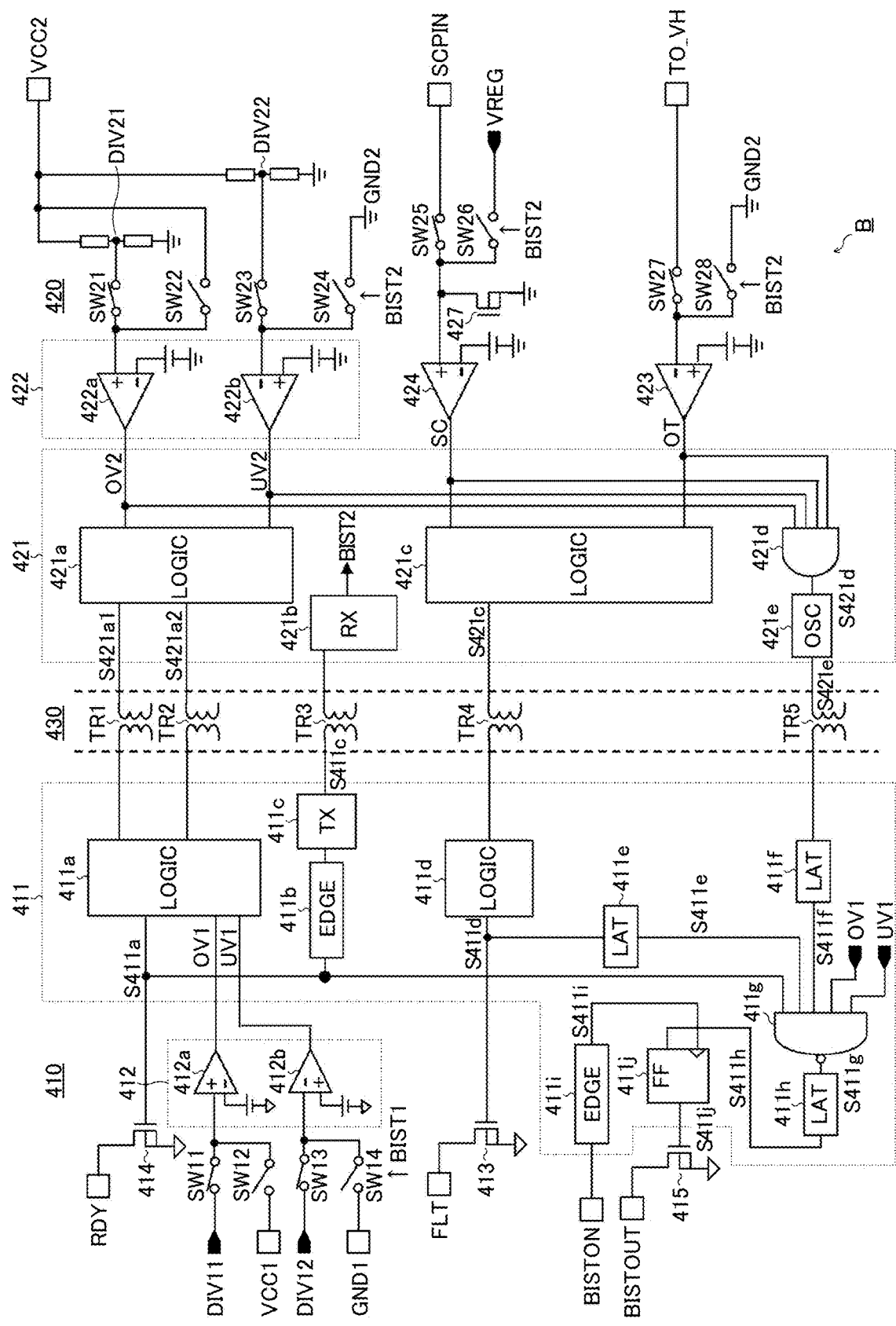
FIG. 12 is a diagram showing one configuration example of a self-test circuit.

FIG. 12 is a diagram showing one configuration example of a self-test circuit built in the signal transmission device 400. The self-test circuit B of this configuration example includes, as part of it, the logic circuits 411 and 421 described previously, and further includes switches SW11 to SW14 and switches SW21 to SW28. Moreover, the transformer chip 430 has integrated in it transformers TR1 to TR5 as isolating elements associated with the self-test circuit B.

First, a description proceeds with focus on the controller chip 410.

The logic circuit 411 includes, as functional blocks associated with the self-test circuit B, for example, a logic block 411a, an edge detector 411b, a pulse transmitter 411c, a logic block 411d, latches 411e and 411f, a NAND gate 411g, a latch 411h, an edge detector 411i, and a flip-flop 411j.

When an undervoltage or overvoltage is detected in either of the UVLO/OVLO circuits 412 and 422, the logic block 411a raises a gate signal S411a for the NMOSFET 414 to high level to turn on the NMOSFET 414, and thereby drops the ready signal RDY to low level (the logic level indicating a fault being detected). The results of detection by the UVLO/OVLO circuit 412 (i.e., an overvoltage detection signal OV1 and an undervoltage detection signal UV1) are fed directly to the logic block 411a. On the other hand, the results of detection by the UVLO/OVLO circuit 422 (i.e., an overvoltage detection signal OV2 and an undervoltage detection signal UV2) are first fed to the logic circuit 421, and are then transmitted via the transformers TR1 and TR2 to the logic block 411a.

The edge detector 411b detects a falling edge in the gate signal S411a (hence a rising edge in the ready signal RDY), and feeds the result of the detection to the pulse transmitter 411c.

When a falling edge in the gate signal S411a is detected by the edge detector 411b, the pulse transmitter 411c transmits a pulse signal S411c (i.e., a self-test instruction signal to the driver chip 420) via the transformer TR3 to the logic circuit 421.

When overheating (or a load power fault) in the driver chip 420 or a short circuit in the power transistors (across high and low sides) is detected, the logic block 411d raises a gate signal S411d for the NMOSFET 413 to high level to turn on the NMOSFET 413, and thereby drops the fault terminal FLT to low level (the logic level indicating a fault being detected). The results of overheat and short-circuit detection (i.e., an overheat detection signal OT and a short detection signal SC) are first fed to the logic circuit 421, and are then transmitted via the transformer TR4 to the logic block 411d.

The latch 411e latches the gate signal S411d with predetermined timing to generate a latched signal S411e, and feeds it to the NAND gate 411g.

The latch 411f latches a secondary-side BIST result (i.e., a pulse signal S421e), which is transmitted from the logic circuit 421 via the transformer TR5, with predetermined timing to generate a latched signal S411f, and feeds it to the NAND gate 411g.

Receiving the gate signal S411a and the latched signals S411e and 411f as well as the overvoltage detection signal OV1 and the undervoltage detection signal UV1, the NAND gate 411g generates a NAND signal S411g. Thus, when at least one of those five signals is at low level (the logic level indicating no fault being detected), the NAND signal S411g is at high level and, when those five signals are all at high level (the logic level indicating a fault being detected), the NAND signal S411g is at low level.

The latch 411h latches the NAND signal S411g with predetermined timing to generate a latched signal S411h, and feeds it to the flip-flop 411j.

The edge detector 411i detects a rising edge in the self-test on signal BISTON, and generates a pulse in a clock signal S411i for the flip-flop 411j.

At the timing of pulse generation in the clock signal S411i, the flip-flop 411j acquires the latched signal S411h, and feeds it as a gate signal S411j for the NMOSFET 415. When the gate signal S411j is at high level, the NMOSFET 415 is on, so that the self-test output signal BISTOUT is at low level (the logic level indicating the self-test result being NG); when the gate signal S411j is at low level, the NMOSFET 415 is off, so that the self-test output signal BISTOUT is in a high-impedance state (the logic level indicating the self-test result being OK).

The UVLO/OVLO circuit 412 is among the targets of the testing by the self-test circuit B, and includes comparators 412a and 412b.

The comparator 412a generates the overvoltage detection signal OV1 by comparing a monitoring target voltage (DIV11 or VCC1), which is fed to the non-inverting input terminal (+) of the comparator 412a, with an overvoltage detection threshold value, which is fed to the inverting input terminal (−) of the comparator 412a. The overvoltage detection signal OV1 is at high level (the logic level indicating faulty condition) when the monitoring target voltage is higher than the overvoltage detection threshold value, and is at low level (the logic level indicating normal condition) when the monitoring target voltage is lower than the overvoltage detection threshold value.

The comparator 412b generates the undervoltage detection signal UV1 by comparing a monitoring target voltage (DIV12 or GND1), which is fed to the inverting input terminal (−) of the comparator 412a, with an undervoltage detection threshold value, which his fed to the non-inverting input terminal (+) of the comparator 412b. The undervoltage detection signal UV1 is at high level (the logic level indicating faulty condition) when the monitoring target voltage is lower than the undervoltage detection threshold value, and is at low level (the logic level indicating normal condition) when the monitoring target voltage is higher than the undervoltage detection threshold value.

The switch SW11 is connected between an application terminal for a division voltage DIV11 (a division voltage of the supply voltage VCC1) and the non-inverting input terminal (+) of the comparator 412a. The switch SW11 is off during a BIST period, and is on during a non-BIST period. On the other hand, the switch SW12 is connected between an application terminal for the supply voltage VCC1 and the non-inverting input terminal (+) of the comparator 412a. The switch SW12 is on during the BIST period, and is off during the non-BIST period. That is, the non-inverting input terminal (+) of the comparator 412a is fed with, as the monitoring target voltage mentioned above, the division voltage DIV11 during the non-BIST period and the supply voltage VCC1 during the BIST period.

The switch SW13 is connected between an application terminal for a division voltage DIV12 (a division voltage of the supply voltage VCC1) and the inverting input terminal (−) of the comparator 412b. The switch SW13 is off during the BIST period, and is on during the non-BIST period. On the other hand, the switch SW14 is connected between an application terminal for the ground voltage GND1 and the inverting input terminal (−) of the comparator 412b. The switch SW14 is on during the BIST period, and is off during the non-BIST period. Thus, the inverting input terminal (−)

of the comparator 412b is fed with, as the monitoring target voltage mentioned above, the division voltage DIV12 during the non-BIST period and the ground voltage GND1 during the BIST period.

The switches SW11 to SW 14 mentioned above are each turned on and off according to a primary-side self-test signal BIST1. For example, the primary-side self-test signal BIST1 is at low level during the BIST period, and is at high level during the non-BIST period.

Next, a description proceeds with focus on the driver chip 420.

The logic circuit 421 includes, as functional blocks associated with the self-test circuit B, for example, a logic block 421a, a pulse receiver 421b, a logic block 421c, an AND gate 421d, and an oscillator 421e.

The logic block 421a transmits the detection results (i.e., an overvoltage detection signal OV2 and an undervoltage detection signal UV2) from the UVLO/OVLO circuit 422 via the transformers TR1 and TR2 to the logic block 411a. For example, when an overvoltage or undervoltage is detected, the logic block 421a suspends the generation of pulse signals 421a1 and S421a2 both (hence the driving of the transformers TR1 and TR2 both). By detecting suspension of the generation of pulse signals 421a1 and S421a2 both (hence the driving of the transformers TR1 and TR2 both), the logic block 411a recognizes detection of an undervoltage or overvoltage in the logic block 421a. On the other hand, when detection of an overvoltage or undervoltage is canceled (when neither is detected), the logic block 421a drives the transformer TR1 or TR2 by using the pulse signal 421a1 or S421a2. For example, when the gate signal (OUTH) for the power transistor is at high level, the transformer TR1 is driven by use of the pulse signal 421a1 and, when the same gate signal (OUTH) is at low level, the transformer TR2 is driven by use of the pulse signal 421a2.

According to the pulse signal S411c (a self-test instruction to the driver chip 420) received via the transformer TR3, the pulse receiver 421b generates a secondary-side self-test signal BIST2.

The logic block 421c transmits the results of overheat and short-circuit detection (i.e., an overheat detection signal OT and a short detection signal SC) via the transformer TR4 to the logic block 411d. For example, when overheating or a short circuit is detected, the logic block 421c drives the transformer TR4 by using a pulse signal S421c.

Receiving the overvoltage detection signal OV2, the undervoltage detection signal UV2, the overheat detection signal OT, and the short detection signal SC, the AND gate 421d generates an AND signal S421d. Thus, when at least one of those four signals is at low level (the logic level indicating no fault being detected), the AND signal S421d is at low level and, when those signals are all at high level (the logic level indicating a fault being detected), the AND signal S421d is at high level.

When the AND signal S421d rises to high level, the oscillator 421e transmits the pulse signal S421e (which is the self-test result to be delivered to the controller chip 410; e.g., 10 MHz, three clocks) via the transformer TR5 to the logic circuit 411.

The UVLO/OVLO circuit 422 is among the targets of the testing by the self-test circuit B, and includes comparators 422a and 422b. The comparators 423 and 424 too are among the targets of the testing by the self-test circuit B.

The comparator 422a generates the overvoltage detection signal OV2 by comparing a monitoring target voltage (DIV21 or VCC2), which is fed to the non-inverting input terminal (+) of the comparator 422a, with an overvoltage detection threshold value, which is fed to the inverting input terminal (−) of the comparator 422a. The overvoltage detection signal OV2 is at high level (the logic level indicating faulty condition) when the monitoring target voltage is higher than the overvoltage detection threshold value, and is at low level (the logic level indicating normal condition) when the monitoring target voltage is lower than the overvoltage detection threshold value.

The comparator 422b generates the undervoltage detection signal UV2 by comparing a monitoring target voltage (DIV22 or GND2), which is fed to the inverting input terminal (−) of the comparator 422b, with an undervoltage detection threshold value, which is fed to the non-inverting input terminal (+) of the comparator 422b. The undervoltage detection signal UV2 is at high level (the logic level indicating faulty condition) when the monitoring target voltage is lower than the undervoltage detection threshold value, and is at low level (the logic level indicating normal condition) when the monitoring target voltage is higher than the undervoltage detection threshold value.

The comparator 423 generates the overheat detection signal OT by comparing a monitoring target voltage (TO_VH or GND2), which is fed to the inverting input terminal (−) of the comparator 423, with an overheat detection threshold value, which is fed to the non-inverting input terminal (+) of the comparator 423. The overheat detection signal OT is at high level (the logic level indicating faulty condition) when the monitoring target voltage is lower than the overheat detection threshold value, and is at low level (the logic level indicating faulty condition) when the monitoring target voltage is higher than the overheat detection threshold value.

The comparator 424 generates the short detection signal SC by comparing a monitoring target voltage (SCPIN or VREG), which is fed to the non-inverting input terminal (+) of the comparator 424, with a short detection threshold value, which is fed to the inverting input terminal (−) of the comparator 424. The short detection signal SC is at high level (the logic level indicating faulty condition) when the monitoring target voltage is higher than the short detection threshold value, and is at low level (the logic level indicating normal condition) when the monitoring target voltage is lower than the short detection threshold value.

The switch SW21 is connected between an application terminal for a division voltage DIV21 (a division voltage of the supply voltage VCC2) and the non-inverting input terminal (+) of the comparator 422a. The switch SW21 is off during the BIST period, and is on during the non-BIST period. On the other hand, the switch SW22 is connected between an application terminal for the supply voltage VCC2 and the non-inverting input terminal (+) of the comparator 422a. The switch SW22 is on during the BIST period, and is off during the non-BIST period. Thus, the non-inverting input terminal (+) of the comparator 422a is fed with, as the monitoring target voltage mentioned above, the division voltage DIV21 during the non-BIST period and the supply voltage VCC2 during the BIST period.

The switch SW23 is connected between an application terminal for a division voltage DIV22 (a division voltage of the supply voltage VCC2) and the inverting input terminal (−) of the comparator 422b. The switch SW23 is off during the BIST period, and is on during the non-BIST period. On the other hand, the switch SW24 is connected between an application terminal for the ground voltage GND2 and the inverting input terminal (−) of the comparator 422b. The switch SW24 is on during the BIST period, and is off during the non-BIST period. Thus, the inverting input terminal (−)

of the comparator 422*b* is fed with, as the monitoring target voltage mentioned above, the division voltage DIV22 during the non-BIST period and the ground voltage GND2 during the BIST period.

The switch SW25 is connected between an application terminal for a short detection voltage SCPIN (the terminal voltage at the short detection terminal SCPIN) and the non-inverting input terminal (+) of the comparator 424. The switch SW25 is off during the BIST period, and is off during the non-BIST period. On the other hand, the switch SW26 is connected between an application terminal for an internal voltage VREG and the non-inverting input terminal (+) of the comparator 424. The switch SW24 is on during the BIST period, and is off during the non-BIST period. Thus, the non-inverting input terminal (+) of the comparator 424 is fed with, as the monitoring target voltage mentioned above, the short detection voltage SCPIN during the non-BIST period and the internal voltage VREG during the BIST period. Moreover, during the BIST period, the NMOSFET 427 is off.

The switch SW27 is connected between an application terminal for an overheat detection voltage TO_VH (the terminal voltage at the overheat/load power fault detection terminal TO_VH) and the inverting input terminal (−) of the comparator 423. The switch SW27 is off during the BIST period and is on during the non-BIST period. On the other hand, the switch SW27 is connected between an application terminal for the ground voltage GND2 and the inverting input terminal (−) of the comparator 423. The switch SW27 is on during the BIST period and is off during the non-BIST period. Thus, the inverting input terminal (−) of the comparator 423 is fed with, as the monitoring target voltage mentioned above, the overheat detection voltage TO_VH during the non-BIST period and the ground voltage GND2 during the BIST period.

The switches SW21 to SW28 mentioned above are each turned on and off according to the secondary-side self-test signal BIST2. For example, the secondary-side self-test signal BIST2 is at low level during the BIST period, and is at high level during the non-BIST period.

The self-test circuit B described above takes as the targets of its testing not only the UVLO/OVLO circuit 412 (comparators 412*a* and 412*b*), the UVLO/OVLO circuit 422 (comparators 422*a* and 422*b*), the overheat detection circuit (comparator 423), and the short detection circuit (comparator 424) but also a first signal transmission path (the transformers TR1 and TR2 for RDY output as well as the transformer TR4 for FLT output) across which fault detection results in the driver chip 420 are transmitted to the controller chip 410, and can check whether those functional blocks are each operating normally.

For example, the testing of whether the comparators 412*a* and 412*b*, the comparators 422*a* and 422*b*, and the comparators 423 and 424 are operating normally can be achieved by feeding each of them with, as the monitoring target voltage fed to them, a test voltage (e.g., the supply voltage VCC1 or VCC2, the ground voltage GND1 or GND2, or the internal voltage VREG) that falls outside the normal input and checking whether the corresponding fault detection signal (OV1/UV1, OV2/UV2, SC, or OT) is at high level (the logic level indicating a fault being detected).

On the other hand, the testing of whether the first signal transmission path (the transformers TR1 and TR2 for RDY output and the transformer TR4 for FLY output) is operating normally can be achieved by checking whether the logic blocks 411*a* and 411*d* keep the ready signal RDY and the fault signal FLT at low level (the logic level indicating a fault being detected), in other words, by checking whether the gate signals S411*a* and S411*d* are kept at high level.

If all of the testing targets mentioned above are operating normally, the five signals (S411*a*, S411*e*, S411*f*, OV1, and UV1) fed to the NAND gate 411*g* are all at high level (the logic level indicating a fault being detected), and thus the NAND signal S411*g* is at low level. Accordingly, when the self-test on signal BISTON is raised to high level, the NMOSFET 415 turns off, leaving the self-test output signal BISTOUT at a high impedance (the logic level indicating the self-test result being OK).

By contrast, if at least one of the testing targets mentioned above is not operating normally, at least one of the five signals (S411*a*, S411*e*, S411*f*, OV1, and UV1) fed to the NAND gate 411*g* is at low level (the logic level indicating no fault being detected), and thus the NAND signal S411*g* is at high level. Accordingly, when the self-test on signal BISTON is raised to high level, the NMOSFET 415 turns on, leaving the self-test output signal BISTOUT at low level (the logic level indicating the self-test result being NG).

As described above, the signal transmission device 400 of this configuration example includes: a first fault detection circuit (a UVLO/OVLO circuit 412) configured to detect a fault in a controller chip 410 provided in a primary circuit system 400*p*; a second fault detection circuit (a UVLO/OVLO circuit 422, a comparator 423 for overheat detection, and a comparator 424 for short-circuit detection) configured to detect a fault in a driver chip 420 provided in a secondary circuit system 400*s*; a first signal transmission path (TR1, TR2, TR4) configured to transmit a detection result (OV2, UV2, OT, and SC) of the second fault detection circuit from the secondary circuit system 400*s* to the primary circuit system 400*p* while isolating between the primary and secondary circuit systems 400*p* and 400*s*; and a self-test circuit B configured to perform a self-test on each of the first fault detection circuit (412), the second fault circuit (422, 423, and 424), and the first signal transmission path (TR1, TR2, and TR4).

The self-test circuit B includes a second signal transmission path (421*d*, 421*e*, and TR5) configured to transmit a self-test result of the second fault detection circuit (422, 423, and 424) from the driver chip 420 in the secondary circuit system 400*s* to the controller chip 410 in the primary circuit system 400*p* while isolating between the controller chip 410 in the primary circuit system 400*p* and the driver chip 420 in the secondary circuit system 400*s*.

In terms of what is shown in FIG. 12, preferably, the second signal transmission path is configured to transmit the fault detection results (OV2, UV, OT, and SC) in the driver chip 420 in the form of a single pulse signal S421*e* by using an AND gate 421*d*, an oscillator 421*e*, and a transformer TR5.

<Self-Test Operation>

Figure 13:
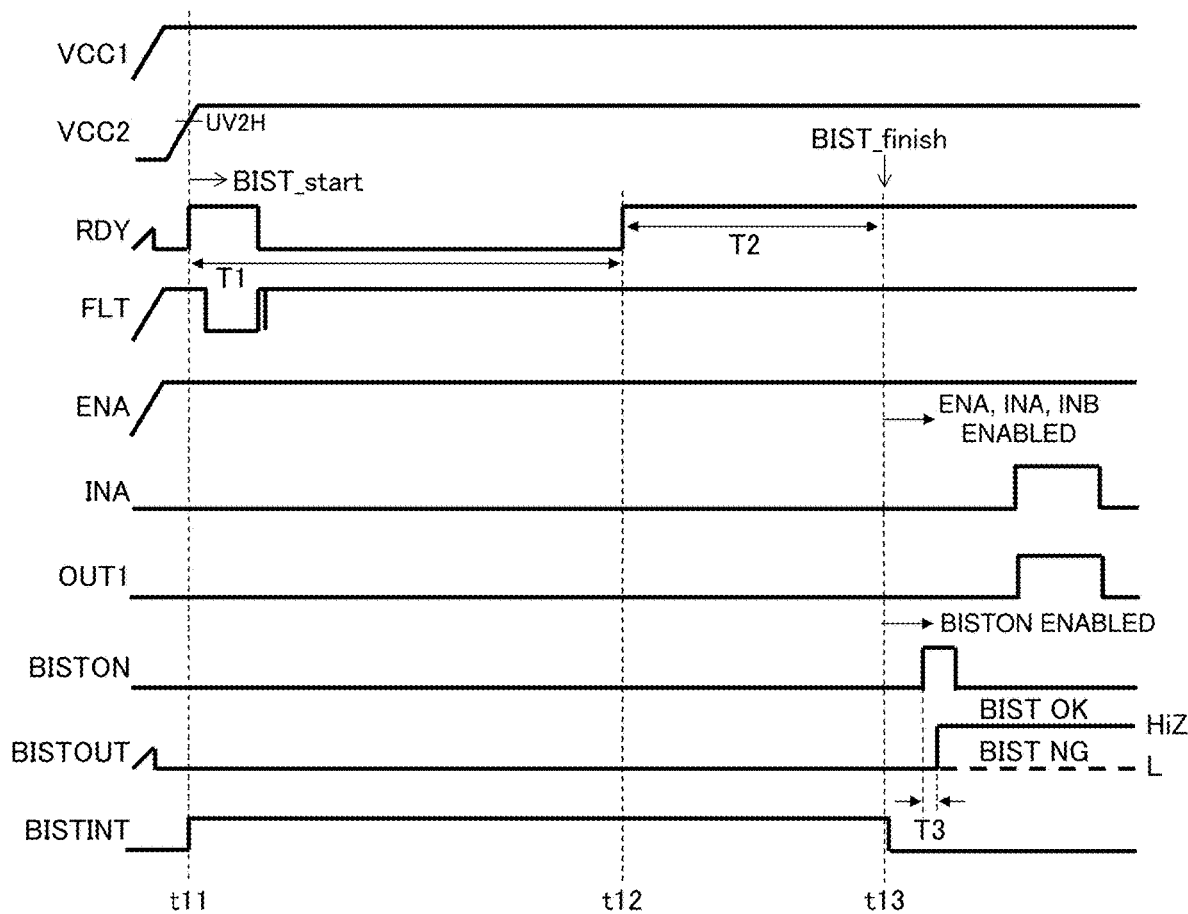
FIG. 13 is a diagram showing a first example (at power start-up) of self-test operation.

FIG. 13 is a diagram showing a first example (at power start-up) of self-test operation, depicting, from top down, the supply voltages VCC1 and VCC2, the ready signal RDY, the fault signal FLT, the enable signal ENA, the input pulse signal INA, the output pulse signal OUT1 (corresponding to the output pulse signal OUT1H mentioned previously), the self-test on signal BISTON, the self-test output signal BISTOUT, and an internal BIST signal BISTINT (a logic signal generated within the logic circuit 411 for the setting of a total self-test period).

After power start-up, when at time point t11 the UVLO on each of the supply voltages VCC1 and VCC2 is canceled and the ready signal RDY rises from low level to high level (into a state where the ready signal RDY is at a high impedance), the internal BIST signal BISTINT rises to high level, and self-test operation is started.

At this point, the switches SW11 and SW13 and the switches SW21, SW23, SW25, and SW27 are off, and the switches SW12 and SW14 and the switches SW22, SW24, SW26, and SW28 are on.

That is, the comparators 412a and 412b, the comparators 422a and 422b, and the comparators 423 and 424 are each fed with, as the monitoring target voltage to be fed to them, a test voltage that falls outside the normal input range (e.g., the supply voltage VCC1 or VCC2, or the ground voltage GND1 or GND2, or the internal voltage VREG).

Incidentally, the internal BIST signal BISTINT can be a signal that does not depend on the enable signal ENA or the like but that only depends on a rising edge in the ready signal RDY. The high-level period of the internal BIST signal BISTINT (corresponding to the total self-test period) can be previously set in an internal timer. This configuration eliminates the need for a completion flag for self-test operation.

During self-test operation, the input pulse signals INA and INB and the enable signal ENA can be kept disabled. Specifically, during self-test operation, the output pulse signal OUT1 (corresponding to OUT1H and OUT1L mentioned previously) can be fixed at low level so that the power transistor remains in the off state.

Likewise, during self-test operation, the self-test on signal BISTON (hence the self-test output signal BISTOUT) can be kept disabled. For example, the self-test on signal BISTON can be masked. Then, even if, during self-test operation, the self-test on signal BISTON is raised to high level, the self-test output signal BISTOUT remains fixed at low level.

Moreover, during self-test operation, the ready signal RDY and the fault signal FLT are both not fixed but have logic levels according to the internal status of the signal transmission device 400. This permits a check, from outside the device, of whether self-test operation is being performed.

When at time point t12 a predetermined period T1 (e.g., 150 μs at the maximum) elapses after the start of self-test operation (time point t11), the switches SW11 and SW13 and the switches SW21, SW23, SW25, and SW27 are turned on, and the switches SW12 and SW14 and the switches SW22, SW24, SW26, and SW28 are turned off.

That is, the comparators 412a and 412b, the comparators 422a and 422b, and the comparators 423 and 424 are fed with the monitoring target voltages that they are inherently designed to be fed with (the division voltages DIV11 and DIV12, the division voltages DIV21 an DIV22, the overheat detection voltage TO_VH, and the short detection voltage SCPIN).

At this point, the ready signal RDY rises to high level; to prevent self-test operation from being started anew, during the high-level period of the internal BIST signal BISTINT, a rising edge in the ready signal RDY can be ignored. In other words, even if during self-test operation RDY turns from L to HiZ, the internal timer that counts the high-level period of the internal BIST signal BISTINT is not reset.

After that, when at time point t13 a predetermined period T2 (e.g., 250 μs at the maximum) elapses after the above-mentioned switching (time point t12), the internal BIST signal BISTINT falls to low level, and the above-mentioned sequence of self-test operation is ended. Thereafter, the input pulse signals INA and INB, the enable signal ENA, and the self-test on signal BISTON are all enabled.

For example, when with a predetermined timing the self-test on signal BISTON is raised to high level, then after a predetermined period T3 elapses, the self-test result at that time point is latched and is output as the self-test output signal BISTOUT. Here, if the self-test result is NG, BISTOUT=L (broken line) and, if the self-test result is OK, BISTOUT=HiZ (solid line). The latching of the self-test output signal BISTOUT can be reset at a falling edge in the ready signal RDY.

Incidentally, if the comparator 412b or 422b is faulty and, even after power start-up, the ready signal RDY does not rise to high level, self-test operation cannot be started. Even so, the condition that, even after power start-up, the ready signal RDY remains at low level indicates some fault in the signal transmission device 400. Thus, an inability to start self-test operation does not pose any serious problem.

Figure 14:
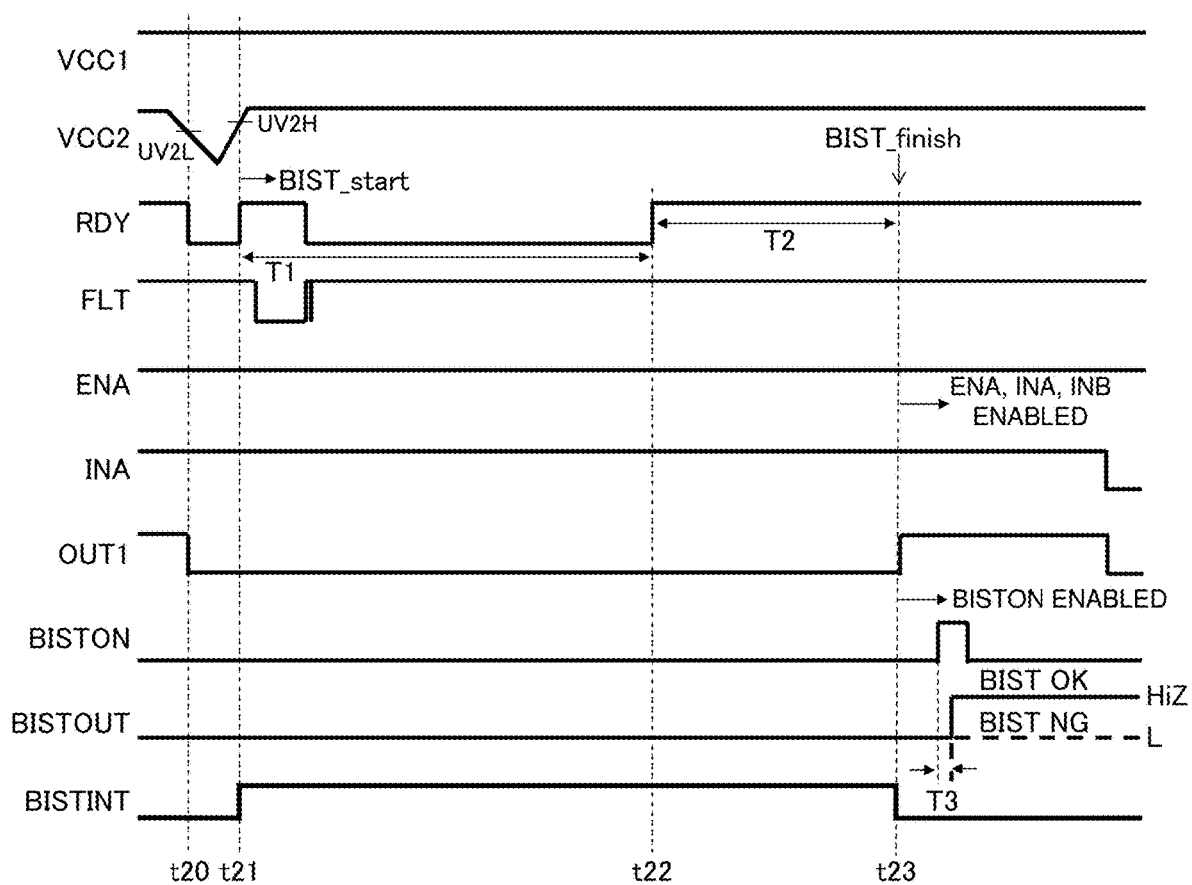
FIG. 14 is a diagram showing a second example (at transition from UV2 detection to cancellation) of self-test operation.

FIG. 14 is a diagram showing a second example (at transition from UV2 detection to fault release) of self-test operation, depicting, like FIG. 13 referred to previously, from top down, the supply voltages VCC1 and VCC2, the ready signal RDY, the fault signal FLT, the enable signal ENA, the input pulse signal INA, the output pulse signal OUT1 (corresponding to the output pulse signal OUT1H mentioned previously), the self-test on signal BISTON, the self-test output signal BISTOUT, and an internal BIST signal BISTINT.

As shown in the diagram, the self-test operation described above is performed not only at power start-up (FIG. 13) but also, for example, in a case where, after UVLO is detected in the supply voltage VCC2 at time point t20, UVLO is canceled at time point t21. The self-test operation after time point t21 is the same as that after time point t11 in FIG. 13, and thus no overlapping description will be repeated.

<Timing Restricting Condition>

Figure 15:
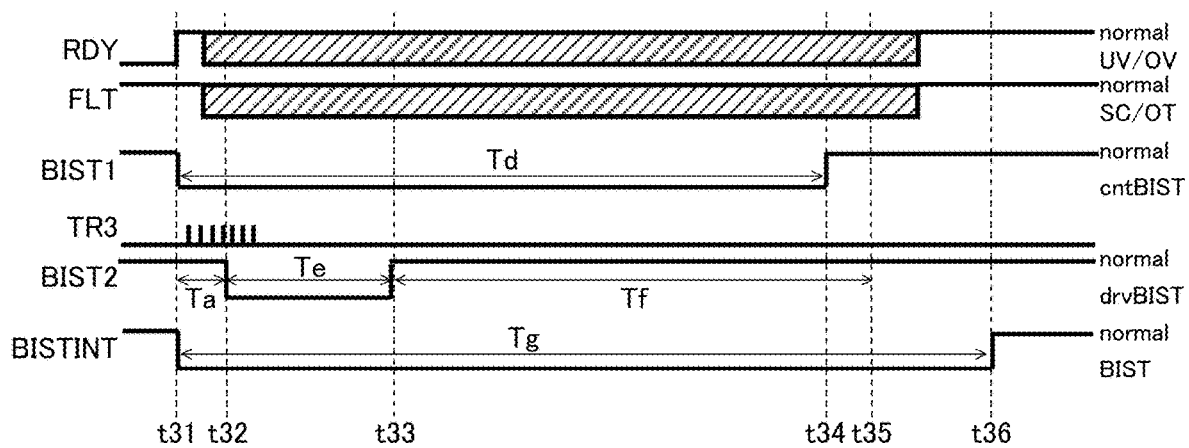
FIG. 15 is a diagram showing timing restricting conditions with respect to relevant signals.

FIG. 15 is a diagram showing timing restricting conditions with respect to the signals relevant to self-test operation, depicting, from top down, the ready signal RDY, the fault signal FLT, the primary-side self-test signal BIST1, the driving pulses for the transformer, the secondary-side self-test signal BIST2, and the internal BIST signal BISTINT.

In the diagram, the logic levels of the internal BIST signal BISTINT are reversed compared with those in FIGS. 13 and 14. Like this, there is no restrictions on the logic levels of various signals including the internal BIST signal BISTINT.

For the ready signal RDY and the fault signal FLT, hatched regions indicate where their logic levels change as self-test operation proceeds.

First, periods Ta, Te, Tf, and Tg shown in the diagram will be described. Period Ta, that is, the period after the ready signal RDY rises to high level at time point t31 until the secondary-side self-test signal BIST2 falls to low level at time point t32, corresponds to a period in which a self-test instruction is transmitted from the primary circuit system 400p to the primary circuit system 400p.

Period Td, that is, the period from time point t31 to time point 34 over which the primary-side self-test signal BIST1 is kept at low level, corresponds to a self-test period (typically 70 μs) with respect to a first fault detection circuit (e.g., the UVLO/OVLO circuit 412).

Period Te, that is, the period from time point t32 to time point 33 over which the secondary-side self-test signal BIST2 is kept at low level, corresponds to a self-test period (typically 30 μs) with respect to a second fault detection circuit (e.g., the UVLO/OVLO circuit 422, the comparator 423 for overheat detection, and the comparator 424 for short-circuit detection).

Period Tf, that is, the period after the secondary-side self-test signal BIST2 rises to high level at time point t33 until the driver chip 420 is restored to normal operation, corresponds to a protection retention period (typically 70 μs) after fault detection cancellation with respect to the secondary circuit system 400s.

Period Tg, that is, the period from time point t31 to time point t36 over which the internal BIST signal BISTINT is kept at low level, corresponds to the total self-test period (typically 200 μs).

Here, as a first timing restricting condition, it is preferable that periods Ta, Te, Tf, and Tg be set such that the maximum value of Ta+Te+Tf is shorter than the minimum value of Tg.

Assuming that, though not shown in the diagram, the fault detection masking period (noise filtering period) of the second fault detection circuit (e.g., the UVLO/OVLO circuit 422, the comparator 423 for overheat detection, and the comparator 424 for short-circuit detection) is Tb and the self-test result transmission period from the secondary circuit system 400s to the primary circuit system 400p is Tc, then as a second timing restricting condition, it is preferable that periods Ta, Tb, Tc, and Td be set such that the maximum value of Ta+Tb+Tc is shorter than the minimum value of Td.

Further, as a third timing restricting condition, it is preferable that periods Tb and Te be set such that the maximum value of Tb is shorter than the minimum value of Te.

<Means for Transmitting a BIST Instruction to the Secondary Circuit System>

Figure 16:
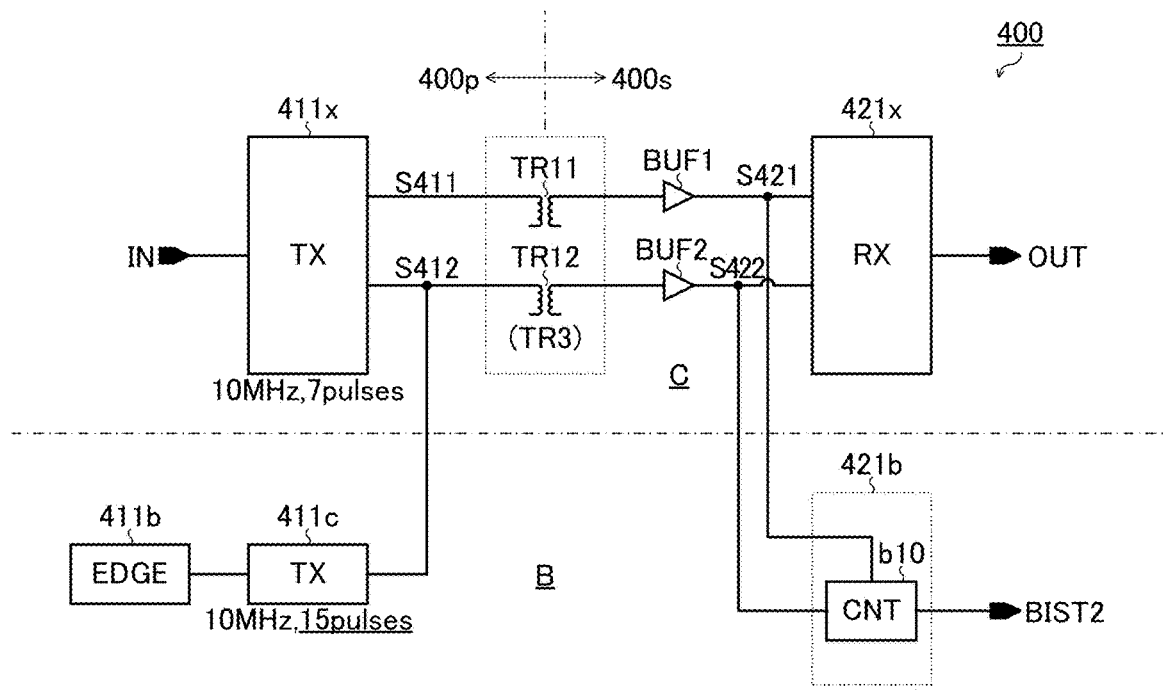
FIG. 16 is a diagram showing a BIST instruction transmission scheme according to a first embodiment.

FIG. 16 is a diagram showing a scheme, according to a first embodiment (pulse number discrimination), for transmitting a self-test instruction (an instruction to start self-test operation in the secondary circuit system 400s, hereinafter also referred to as a BIST instruction) from the primary circuit system 400p to the secondary circuit system 400s.

Prior to a description of BIST instruction transmission schemes in the self-test circuit B, a brief description will be given of an isolated signal transmission circuit C as a principal functional block in the signal transmission device 400.

The isolated signal transmission circuit C transmits a pulse signal from a primary circuit system 400p to a secondary circuit system 400s via transformers TR11 and TR12, which are integrated in the transformer chip 430, while isolating between the primary and secondary circuit systems 400p and 400s. In terms of what is shown in FIG. 16, the isolated signal transmission circuit C transmits an input pulse signal IN (e.g., corresponding to the input pulse signal INA mentioned previously) to the primary circuit system 400p as an output pulse signal OUT (e.g., corresponding to the output pulse signal OUT1H mentioned previously) from the secondary circuit system 400s.

For example, the isolated signal transmission circuit C includes a pulse transmitter 411x, a pulse receiver 421x, transformers TR11 and TR12, and buffers BUF1 and BUF2.

The pulse transmitter 411x pulse-drives one of transmission pulse signals S411 and S412 according to the logic level of the input pulse signal IN. For example, when indicating that the input pulse signal IN is at high level, the pulse transmission circuit 411x pulse-drives (outputs a single or a plurality of pulses in) a transmission pulse signal S411, which is fed to the primary winding of the transformer TR11; when indicating that the input pulse signal IN is at low level, the pulse transmission circuit 211 pulse-drives a transmission pulse signal S412, which is fed to the primary winding of the transformer TR12.

For example, it is assumed that, when pulse-driving either of the transmission pulse signals S411 and S412, the pulse transmitter 411x generates seven pulses in it at 10 MHz.

The pulse transmitter 411x is one of the functional blocks included in the logic circuit 411, and is integrated in the controller chip 410 in the primary circuit system 400p.

According to reception pulse signals S421 and S422 fed from the transformers TR11 and TR12 via the buffers BUF1 and BUF2 respectively, the pulse receiver 421x generates an output pulse signal OUT. For example, on detecting an induced pulse in the reception pulse signal S421 that appears in the secondary winding of the transformer TR11 as a result of the transmission pulse signal S411 being pulse-driven, the pulse receiver 421x erases the output pulse signal OUT to high level. On the other hand, on detecting an induced pulse in the reception pulse signal S422 that appears in the secondary winding of the transformer TR12 as a result of the transmission pulse signal S412 being pulse-driven, the pulse receiver 421x drops the output pulse signal OUT to low level. Thus, according to the logic level of the input pulse signal IN, the output pulse signal OUT switches its logic level.

The pulse receiver 421x is one of the functional blocks included in the logic circuit 421 mentioned previously, and is integrated in the driver chip 420 in the secondary circuit system 400s.

According to the transmission pulse signal S411 fed to its primary winding, the transformer TR11 outputs from its secondary winding the reception pulse signal S421. On the other hand, according to the transmission pulse signal S412 fed to its primary winding, the transformer TR12 outputs from its secondary winding the reception pulse signal S422.

The transformers TR11 and TR12 are both integrated in the transformer chip 430. The transformer chip 430, while isolating between the controller chip 410 and the driver chip 420 with the transformers TR11 and TR12, transmits the transmission pulse signals S411 and S412 fed from the pulse transmitter 411x to, as the reception pulse signals S421 and S422 respectively, to the pulse receiver 421x.

In this way, owing to the characteristics of spiral coils used in isolated communication, the input pulse signal IN is split into two transmission pulse signals S411 and S412 (corresponding to a rise signal and a fall signal) to be transmitted via the two transformers TR11 and TR12 from the primary circuit system 400p to the secondary circuit system 400s.

Here, preferably, the self-test circuit B is configured to share part of the isolated signal transmission circuit C as a means for transmitting a BIST instruction from the primary circuit system 400p to the secondary circuit system 400s, more specifically, to share, as the transformer TR3 in FIG. 12, the transformer TR12 in the isolated signal transmission circuit C (the transformer for transmitting a gate-off signal for the power transistor).

In terms of what is shown in FIG. 16, in the self-test circuit B of this configuration example, when the edge detector 411b detects a falling edge in the gate signal S411a, the pulse transmitter 411c pulse-drives the transmission pulse signal S412 fed to the primary winding of the transformer TR12 (corresponding to the transformer TR3), and thereby transmits a BIST instruction to the secondary circuit system 400s. On the other hand, by receiving the reception pulse signal S422 transmitted via the transformer TR12 (corresponding to the transformer TR3), the pulse receiver 421b generates the secondary-side self-test signal BIST2.

This configuration eliminates the need for a dedicated signal transmission path (a separate transformer), and thus helps achieve size reduction in the transformer chip 430 (hence the signal transmission device 400 as a whole).

Meanwhile, sharing the transformer TR12 in the isolated signal transmission circuit C as described above necessitates discriminating whether the reception pulse signal S422 transmitted via the transformer TR12 is the gate-off signal for the power transistor or a BIST instruction.

Accordingly, the self-test circuit B (in particular, the pulse transmitter 411c), when transmitting a BIST instruction from the primary circuit system 400p to the secondary circuit system 400s, drives the transmission pulse signal S412, which inherently functions as the gate-off signal for the power transistor, with a different number of pulses than usually, thereby achieving signal discrimination based on a difference in the number of pulses.

For example, when turning off the power transistor, the pulse transmitter 411x in the isolated signal transmission circuit C generates seven pulses at 10 MHz in the transmission pulse signal S412. By contrast, when transmitting a BIST instruction, the pulse transmitter 411c in the self-test circuit B generates 15 pulses at 10 MHz in the transmission pulse signal S412.

Accordingly, for example, the pulse receiver 421b in the self-test circuit B can count the number of pulses in the reception pulse signal S422 with a counter b10 so that, if the number of pulses in the reception pulse signal S422 is eight or more (e.g., eleven), it can recognize the reception pulse signal S422 as a BIST instruction and generates the secondary-side self-test signal BIST2. Even if 11 pulses are sufficient for recognition of a BIST instruction, generating 15 pulses helps secure redundancy in case of missing pulses.

After recognizing a BIST instruction, the pulse receiver 421b can keep the driver chip 420 in a BIST mode for a predetermined period (corresponding to period Te in FIG. 15; 35 μm at the maximum, 20 μs at the minimum) and then, after the lapse of the predetermined period, terminate the BIST mode. This configuration eliminates the need to receive a BIST mode termination signal from the controller chip 410.

During the transmission of a BIST instruction, as during the gate-off period of the power transistor, the transmission pulse signal S412 is pulse-driven. Accordingly, the pulse receiver 421x in the isolated signal transmission circuit C drops the output pulse signal OUT to low level to keep the power transistor off. This prevents malfunctioning of the motor 4 during a self-test by the signal transmission device 400.

Though not specifically shown in FIG. 16, as a means for preventing malfunctioning ascribable to common mode noise, a noise mask circuit may be built in the pulse receivers 421x and 421b. Moreover, as a means for suppressing logic corruption in the counter b10, an RC filter for suppressing variation of the logic power can be built in the pulse receiver 421b.

In normal operation of the signal transmission device 400, the input pulse signal IN may repeatedly sway between high and low levels. In that case, every falling edge in the input pulse signal IN causes seven pulses to appear in the reception pulse signal S422. Thus, cumulatively counting such consecutive pulses may lead to erroneous recognition of a BIST instruction. To prevent that, preferably, the counter b10 in the UVLO/OVLO circuit 422 is reset every time pulses are generated in the transmission pulse signal S411 (hence the reception pulse signal S421).

What needs to be taken into account is that the pulse transmitter 411x in the isolated signal transmission circuit C may be provided with a function of detecting disagreement between the input pulse signal IN and the output pulse signal OUT and repeating the pulse-driving of the transmission pulse signal S411 or S412. In that case, for example, if while the input pulse signal IN is at low level the output pulse signal OUT remains at high level, the transmission pulse signal S412 may be pulse-driven with 11 or more consecutive pulses (seven pulses repeated n times). Thus, with the BIST instruction transmission scheme according to the first example, which achieves signal discrimination based on a difference in the number of pulses, even if the counter b10 is reset as described above, a BIST instruction may be recognized erroneously.

Proposed below will be another BIST instruction transmission scheme (according to a second embodiment) that is free from the inconveniences mentioned above.

Figure 17:
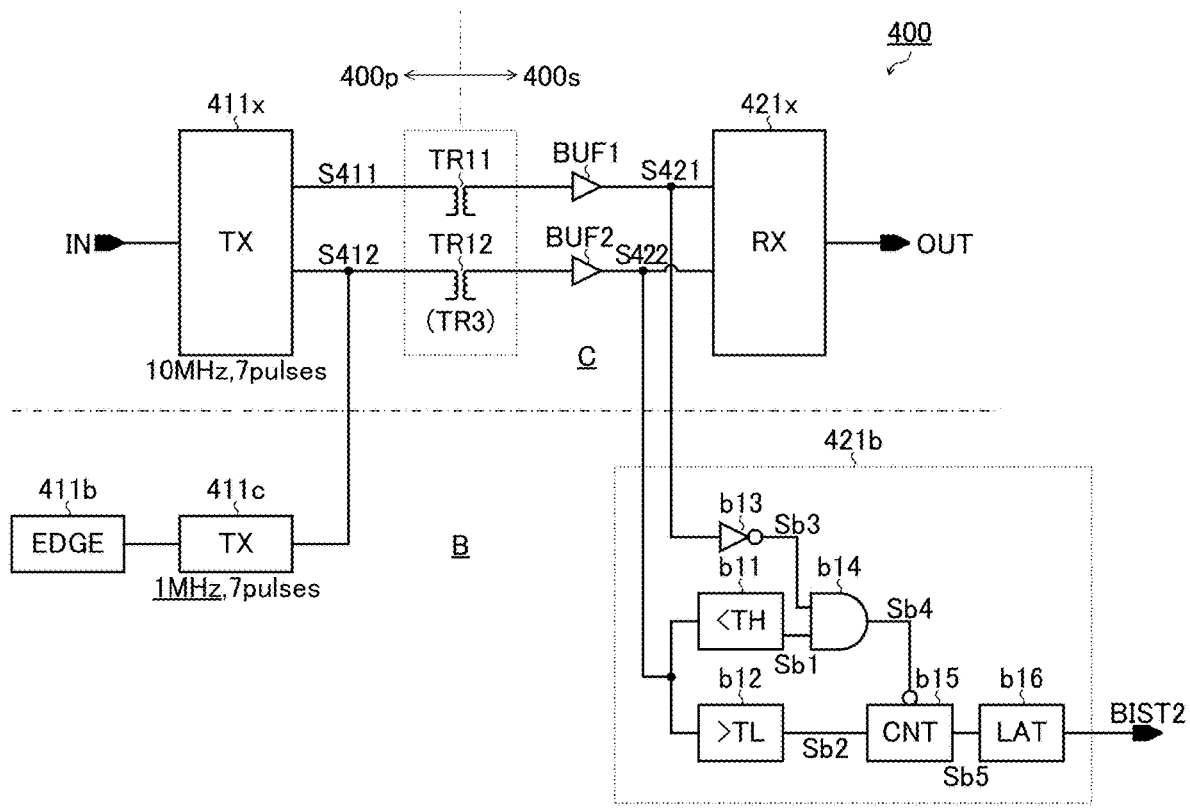
FIG. 17 is a diagram showing a BIST instruction transmission scheme according to a second embodiment.

FIG. 17 is a diagram showing a scheme, according to a second embodiment (pulse period discrimination), for transmitting a BIST instruction from the primary circuit system 400p to the secondary circuit system 400s. In the signal transmission device 400 according to this embodiment, the self-test circuit B (in particular, the pulse transmitter 411c), when transmitting a BIST instruction from the primary circuit system 400p to the secondary circuit system 400s, drives the transmission pulse signal S412, which inherently functions as the gate-off signal for the power transistor, with a different pulse period than in ordinary operation, thereby achieving signal discrimination based on a difference in the pulse period.

For example, as described previously, when turning off the power transistor, the pulse transmitter 411x generates seven pulses at 10 MHz (period T=0.1 μs) in the transmission pulse signal S412. By contrast, when transmitting a BIST instruction, the pulse transmitter 411c in the self-test circuit B generates seven pulses at 1 MHz (period T=1 μs) in the transmission pulse signal S412.

The pulse receiver 421b in the self-test circuit B includes, for example, an upper-limit period checker b11, a lower-limit period checker b12, an inverter b13, an AND gate b14, a counter b15, and a latch b16.

The upper-limit period checker b11 outputs an internal signal Sb1 for confirming that the pulse period T of the reception pulse signal S422 is shorter than a upper-limit period TH (e.g., TH=1.5 μm). The internal signal Sb1, for example, turns to high level when a pulse is generated in the reception pulse signal S422, and turns to low level when the upper-limit period TH elapses without the next pulse being generated. That is, the internal signal Sb1 is kept at high level while T<TH, and falls to low level when it turns out that T>TH.

The lower-limit period checker b12 outputs an internal signal Sb2 for confirming that the pulse period T of the reception pulse signal S422 is longer than a lower-limit period TL (e.g., TL=0.5 μm). The internal signal Sb2, for example, turns to low level when a pulse is generated in the reception pulse signal S422, and turns to high level when the lower-limit period TL elapses without the next pulse being generated. That is, the internal signal Sb2 is kept at low level while T<TL, and rises to high level when it turns out that T>TL. In other words, when T>TL, the internal signal Sb2 is pulse-driven at the pulse period T.

The inverter b13 inverts the logic level of the reception pulse signal S421 (corresponding to the gate-on signal), and thereby generates an internal signal Sb3. Accordingly, the internal signal Sb3 is at low level when the reception pulse signal S421 is at high level, and is high level when the reception pulse signal S421 is at low level.

The AND gate b14 performs an AND operation between the internal signals Sb1 and Sb3, and thereby generates an internal signal Sb4. Accordingly, the internal signal Sb4 is at low level when at least one of the internal signals Sb1 and Sb3 is at low level, and is at high level when the internal signals Sb1 and Sb3 are both at high level. That is, the internal signal Sb4 is at low level when the pulse period T of the reception pulse signal S422 is longer than the upper-limit period TH, or when a pulse is generated in the reception pulse signal S421.

The counter b15 counts the number of pulses in the internal signal Sb2, and thereby generates the internal signal Sb4. For example, when the number of pulses in the internal signal Sb2 reaches a predetermined threshold value (e.g., three), the counter b15 raises an internal signal Sb5 to high level. Incidentally, the count value of the counter b15 (i.e., the number of pulses in the internal signal Sb2) is reset to zero when the internal signal Sb4 is dropped to low level.

The latch b16 receives the internal signal Sb5 and generates the secondary-side self-test signal BIST2. More specifically, the latch b16 can, for a predetermined period (corresponding to period Te in FIG. 15; 35 μs at the maximum, 20 μs at the minimum) after a rise of the internal signal Sb5, keep the secondary-side self-test signal BIST2 at the logic level that it has in the BIST mode and, at the lapse of the just-mentioned predetermined period, turn the secondary-side self-test signal BIST2 back to the logic level that it has when the BIST mode is terminated. This configuration eliminates the need to receive a BIST mode termination signal from the controller chip 410.

With the pulse receiver 421b of this configuration example, it is possible, on receipt of a plurality of (e.g., three or more) pulses in the reception pulse signal S422 with a pulse period T within a predetermined range (TL<T<TH), to judge that the reception pulse signal S422 is a BIST instruction and generate the secondary-side self-test signal BIST2. Even if three pulses are sufficient for recognition of a BIST instruction, generating seven pulses helps secure redundancy in case of missing pulses.

During transmission of a BIST instruction, as during the gate-off period of the power transistor, the transmission pulse signal S412 is pulse-driven. Accordingly, the pulse receiver 421x in the isolated signal transmission circuit C drops the output pulse signal OUT to low level and thus the power transistor is turned off. This prevent malfunctioning of the motor 4 during a self-test by the signal transmission device 400.

Though not specifically shown in FIG. 17, as a means for preventing malfunctioning ascribable to common mode noise, a noise mask circuit can be built in the pulse receivers 421x and 421b. Moreover, as a means for suppressing logic corruption in the counter b15, an RC filter for suppressing variation of the logic power can be built in the pulse receiver 421b. These modifications are similar as in the first example (pulse number discrimination) described previously.

Moreover, as described previously, in normal operation of the signal transmission device 400, the input pulse signal IN may repeatedly sway between high and low levels. Here, if the pulse period of the input pulse signal IN is close to the pulse period (e.g., 1 μs) of the transmission pulse signal S412 generated by the pulse transmitter 411c in the self-test circuit B, the pulse period T of the pulses in the reception pulse signal S422 that appear every falling edge in the input pulse signal IN may apparently fall within the previously mentioned predetermined range (TL<T<TH), leading to erroneous recognition of a BIST instruction. To prevent that, preferably, as in this configuration example, the counter b15 in the pulse receiver 421b is reset every time pulses are generated in the transmission pulse signal S411 (hence the reception pulse signal S421).

With the BIST instruction transmission scheme according to the second example, which achieves signal discrimination based on a difference in the pulse period, even if the pulse transmitter 411x in the isolated signal transmission circuit C is provided with a function of detecting disagreement between the input pulse signal IN and the output pulse signal OUT and repeatedly pulse-driving the transmission pulse signal S411 or S412, there is no possibility of erroneous recognition of a BIST instruction.

Figure 18:
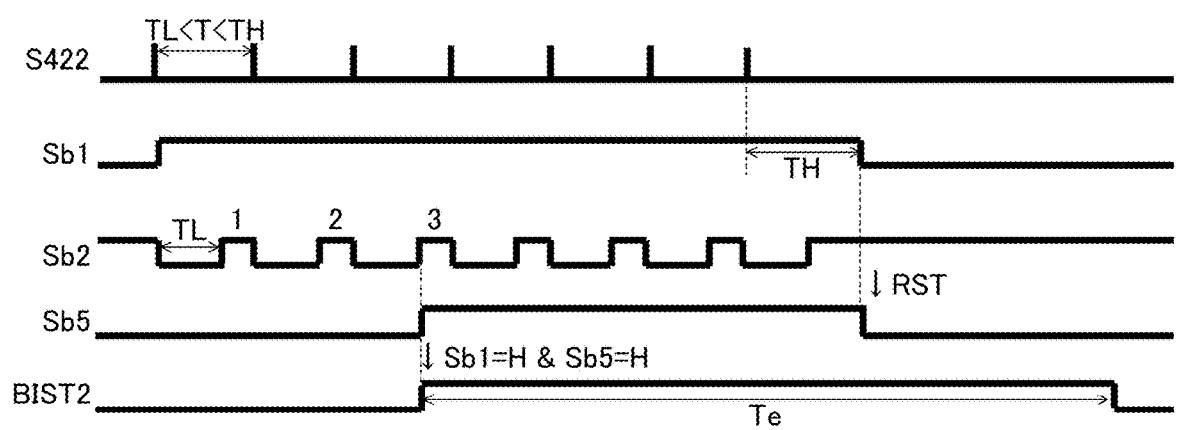
FIG. 18 is a diagram showing a first example (TL<T<TH) of BIST instruction transmission operation.

FIG. 18 is a diagram showing a first example (TL<T<TH) of BIST instruction transmission operation according to the second embodiment, depicting, from top down, the reception pulse signal S422, the internal signals Sb1, Sb2, and Sb5, and the secondary-side self-test signal BIST2.

In the diagram, the logic levels of the secondary-side self-test signal BIST2 are reversed compared with those in FIG. 15. Like this, there is no restrictions on the logic levels of various signals including the secondary-side self-test signal BIST2.

In a case where the pulse period T of the reception pulse signal S422 falls within the predetermined range (TL<T<TH), while the internal signal Sb1 is kept at high level, consecutive pulses are generated in the internal signal Sb2. Meanwhile the counter b15 keeps counting the number of pulses in the internal signal Sb2 without being reset and, when the count value reaches a predetermined threshold value (in the diagram, three), raises the internal signal Sb5 to high level. As a result, the secondary-side self-test signal BIST2 turns to high level and, for period Te, self-test operation is performed in the driver chip 420. After pulses cease to be generated in the reception pulse signal S422, when the upper-limit period TH elapses, the internal signal Sb1 falls to low level and the counter b15 is reset; thus the internal signal Sb5 too falls to low level.

Figure 19:
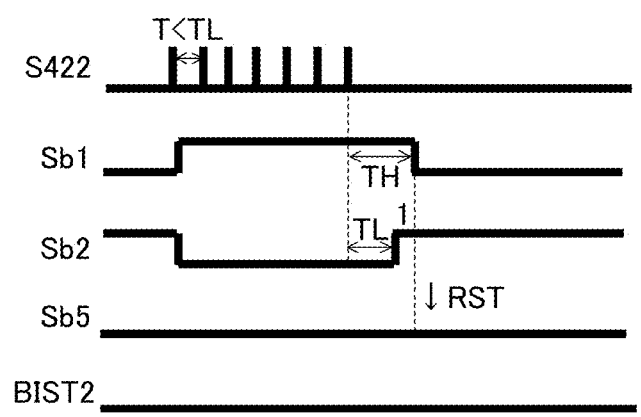
FIG. 19 is a diagram showing a second example (T<TL) of BIST instruction transmission operation.

FIG. 19 is a diagram showing a second example (T<TL) of BIST instruction transmission operation according to the second embodiment, depicting, like FIG. 18 referred to previously, from top down, the reception pulse signal S422, the internal signals Sb1, Sb2, and Sb5, and the secondary-side self-test signal BIST2.

The second example shown there deals with a case where the pulse period T of the reception pulse signal S422 is short (e.g., a case where the usual gate-off signal is being transmitted). In this case, the internal signal Sb2 does not rise to high level (no pulses are generated), and thus the count value of the counter b15 does not reach the predetermined threshold value. As a result, the secondary-side self-test signal BIST is kept at low level; thus the driver chip 420 does not switch to the BIST mode. Incidentally, after pulses cease to be generated in the reception pulse signal S422, when the lower-limit period TL elapses, the internal signal Sb2 rises to high level, and the count value is incremented by one. With no delay thereafter, the internal signal Sb1 falls to low level, and the counter b15 is reset; thus the internal signal Sb5 does not rise to high level.

Figure 20:
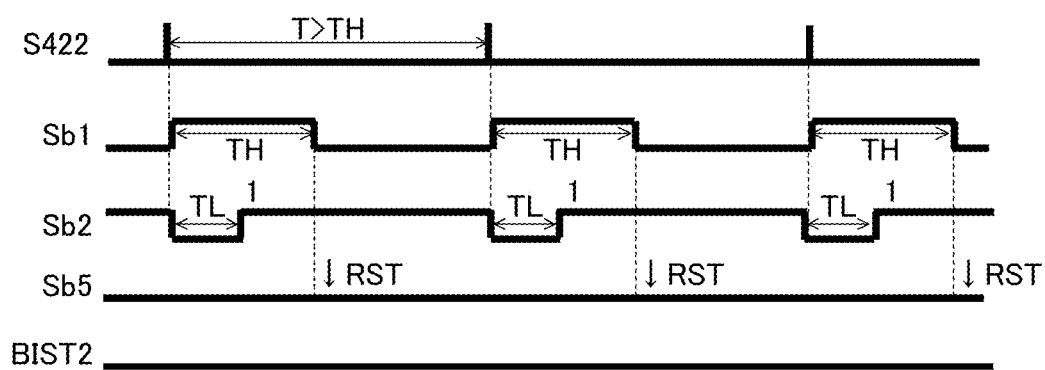
FIG. 20 is a diagram showing a third example (T>TH) of BIST instruction transmission operation.

FIG. 20 is a diagram showing a third example (T>TH) of BIST instruction transmission operation according to the second embodiment, depicting, like FIGS. 18 and 19 referred to previously, from top down, the reception pulse signal S22, the internal signals Sb1, Sb2, and Sb5, and the secondary-side self-test signal BIST2.

The third example shown there deals with a case where the pulse period T of the reception pulse signal S422 is short (e.g., a case where it is mixed periodically with noise of 0.1 MHz). In this case, every time a pulse is generated in the reception pulse signal S422, the internal signal Sb2 rises to high level and the count value is incremented by one.

However, before the next pulse is generated, the upper-limit period TH elapses and the internal signal Sb1 falls to low level; thus the internal signal Sb5 does not rise the high level. As a result, the secondary-side self-test signal BIST is kept at low level, and thus the driver chip 420 does not switch to the BIST mode.

<Application to Vehicles>

Figure 21:
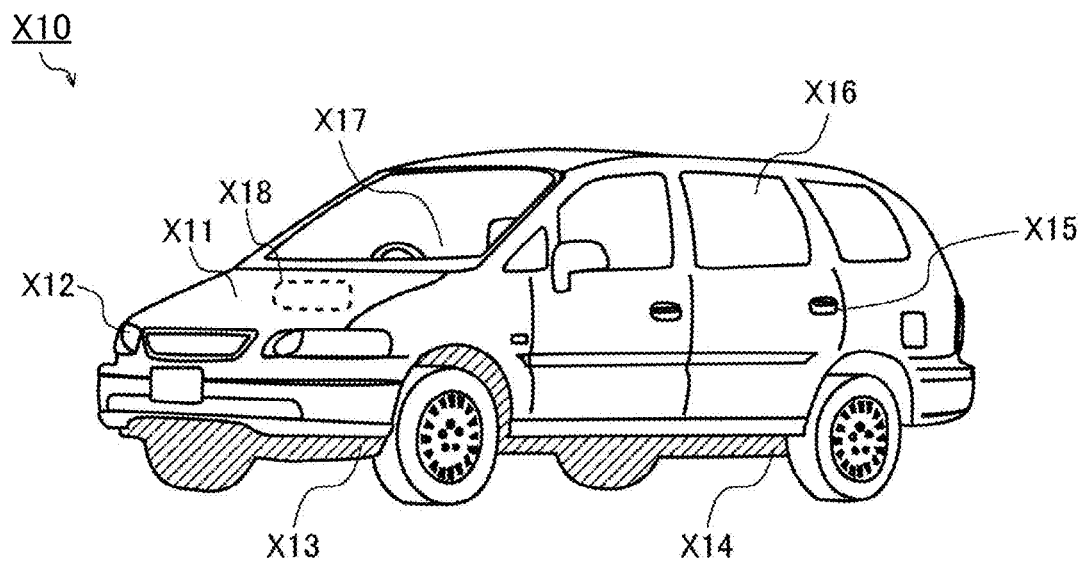
FIG. 21 is a diagram showing the exterior appearance of a vehicle that incorporates an electronic device.

FIG. 21 is a diagram showing the exterior appearance of a vehicle that incorporates an electronic device. The vehicle X10 of this configuration example incorporates electronic devices X11 to X18 that operate by being supplied with electric power from an unillustrated battery.

The vehicle X10 can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

For the sake of convenience, in the diagram, the electronic devices X11 to X18 may be shown at places different from where they are actually arranged.

The electronic device X11 is an electronic control unit that performs control with respect to an engine (injection control, electronic throttle control, idling control, oxygen sensor heater control, automatic cruise control, etc.), or an electronic control unit that performs control with respect to a motor (torque control, electric power regeneration control, etc.).

The electronic device X12 is a lamp control unit that controls the lighting and extinguishing of HIDs (high-intensity discharged lamps), DRLs (daytime running lamps), and the like.

The electronic device X13 is a transmission control unit that performs control with respect to a transmission.

The electronic device X14 is a movement control unit that performs control with respect to the movement of the vehicle X10 (ABS [anti-lock brake system] control, EPS [electric power steering] control, electronic suspension control, and the like).

The electronic device X15 is a security control unit that drives and controls door locks, burglar alarms, and the like.

The electronic device X16 comprises electronic devices incorporated in the vehicle X10 as standard or manufacturer-fitted equipment at the stage of factory shipment, such as wipers, power side mirrors, power windows, dampers (shock absorbers), a power sun roof, and power seats.

The electronic device X17 comprises electronic devices fitted to the vehicle X10 optionally as user-fitted equipment, such as A/V (audio/visual) equipment, a car navigation system, and an ETC (electronic toll control system).

The electronic device X18 comprises electronic devices provided with high-withstand-voltage motors, such as a vehicle-mounted blower, an oil pump, a water pump, and a battery cooling fan.

The electronic devices X11 to X18 can be understood as specific examples of the electronic device A described previously. That is, the signal transmission device 400 described previously can be built into any of the electronic devices X11 to X18.

Overview

To follow is an overview of the various embodiments described above.

For example, according to one aspect of what is disclosed herein, a signal transmission device that transmits a driving signal for a power transistor from a primary circuit system to a secondary circuit system while isolating between the primary and secondary circuit systems includes: a first fault detection circuit configured to detect a fault in the primary circuit system; a second fault detection circuit configured to detect a fault in the secondary circuit system; a first signal transmission path configured to transmit the result of detection by the second fault detection circuit from the secondary circuit system to the primary circuit system while isolating between the primary and secondary circuit systems; and a self-test circuit configured to perform a self-test on each of the first fault detection circuit, the second fault detection circuit, and the first signal transmission path. (A first configuration.)

In the signal transmission device according to the first configuration described above, the self-test circuit may include a second signal transmission path configured to transmit the result of the self-test on the second fault detection circuit from the secondary circuit system to the primary circuit system while isolating between the primary and secondary circuit systems. (A second configuration.)

In the signal transmission device according to the first or second configuration described above, when the self-test instruction transmission period from the primary circuit system to the secondary circuit system is represented by Ta, the self-test period with respect to the second fault detection circuit is represented by Te, the protection retention period after cancellation of fault detection in the secondary circuit system is represented by Tf, and the total self-test period is represented by Tg, then the maximum value of Ta+Te+Tf may be less than the minimum value of Tg. (A third configuration.)

In the signal transmission device according to any of the first to third configuration described above, when the self-test instruction transmission period from the primary circuit system to the secondary circuit system is represented by Ta, the fault detection masking period Tb of the second fault detection circuit is represented by Tb, the self-test result transmission period from the secondary circuit system to the primary circuit system is represented by Tc, and the self-test period with respect to the first fault detection circuit is represented by Td, then the maximum value of Ta+Tb+Tc may be less than the minimum value of Td. (A fourth configuration.)

In the signal transmission device according to any of the first to fourth configuration described above, when the fault detection masking period Tb of the second fault detection circuit is represented by Tb, and the self-test period with respect to the second fault detection circuit is represented by Te, then the maximum value of Tb may be less than the minimum value of Te. (A fifth configuration.)

In the signal transmission device according to any of the first to fifth configuration described above, the self-test circuit may be configured to transmit a self-test instruction from the primary circuit system to the secondary circuit system by driving an off signal for the power transistor with a number of pulses different than in ordinary operation. (A sixth configuration.)

In the signal transmission device according to any of the first to fifth configuration described above, the self-test circuit may be configured to transmit a self-test instruction from the primary circuit system to the secondary circuit system by driving an off signal for the power transistor with a pulse period different than in ordinary operation. (A seventh configuration.)

In the signal transmission device of any of the first to seventh configurations described above, a first chip having integrated on it the circuit elements of the primary circuit system, a second chip having integrated on it circuit the elements of the secondary circuit system, and a third chip having integrated on it an isolating element configured to isolate between the primary and secondary circuit systems may be sealed in a single package. (An eighth configuration.)

According to another aspect of what is disclosed herein, an electronic device includes: a power transistor; and a gate driver IC configured to drive a gate of the power transistor. Here, the gate driver IC is the signal transmission device according to any of the first to eighth configurations described above. (A ninth configuration.)

According to yet another aspect of what is disclosed herein, a vehicle includes the electronic device according to the ninth configuration described above. (A tenth configuration.)

Other Modifications

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope and sense equivalent to those claims.

REFERENCE SIGNS LIST

1H(u/v/w) high-side gate driver IC
1L(u/v/w) low-side gate driver IC
2H(u/v/w) high-side power transistor
2L(u/v/w) low-side power transistor
3 ECU
4 motor
5 semiconductor device
11, 11A-11F low-potential terminal
12, 12A-12F high-potential terminal
21, 21A-21D transformer
22 low-potential coil (primary coil)
23 high-potential coil (secondary coil)
24 first inner end
25 first outer end
26 first spiral portion
27 second inner end
28 second outer end
29 second spiral portion
31 first low-potential wiring
32 second low-potential wiring
33 first high-potential wiring
34 second high-potential wiring
41 semiconductor chip
42 first principal surface
43 second principal surface
44A-44D chip side wall
45 first functional device
51 insulation layer
52 insulation principal surface
53A-53D insulation side wall
55 bottom insulation layer
56 top insulation layer
57 interlayer insulation layer
58 first insulation layer
59 second insulation layer
60 second functional device
61 sealing conductor
62 device region
63 outer region
64 sealing plug conductor
65 sealing via conductor
66 first inner region
67 second inner region
71 through wiring
72 low-potential connection wiring
73 lead wiring
74 first connection plug electrode
75 second connection plug electrode
76 pad plug electrode
77 substrate plug electrode
78 first electrode layer
79 second electrode layer
80 wiring plug electrode
81 high-potential connection wiring
82 pad plug electrode
85 dummy pattern
86 high-potential dummy pattern
87 first high-potential dummy pattern
88 second high-potential dummy pattern
89 first region
90 second region
91 third region
92 first connection part
93 first pattern
94 second pattern
95 third pattern
96 first outer circumferential line
97 second outer circumferential line
98 first middle line
99 first connection line
100 slit
130 separation structure
140 inorganic insulation layer
141 first inorganic insulation layer
142 second inorganic insulation layer
143 low-potential pad opening
144 high-potential pad opening
145 organic insulation layer
146 first part
147 second part
148 low-potential terminal opening
149 high-potential terminal opening
200 signal transmission device
200p primary circuit system
200s secondary circuit system
210 controller chip (first chip)
211 pulse transmission circuit (pulse generator)
212, 213 buffer
220 driver chip (second chip)
221, 222 buffer
223 pulse reception circuit (RS flip-flop)
224 driver
230 transformer chip (third chip)
230a first wiring layer (lower layer)
230b second wiring layer (upper layer)
231, 232 transformer
231p, 232p primary coil
231s, 232s secondary coil
300 transformer chip
301 first transformer
302 second transformer
303 third transformer
304 fourth transformer 305 first guard ring
306 second guard ring
400 signal transmission device (isolated gate driver IC)
400*p* primary circuit system
400*s* secondary circuit system
410 controller chip
411 logic circuit
411*a* logic block
411*b* edge detector
411*c* pulse transmitter
411*d* logic block
411*e*, 411*f* latch
411*g* NAND gate
411*h* latch
411*i* edge detector
411*j* flip-flop
411*x* pulse transmitter
412 UVLO/OVLO circuit
412*a*, 412*b* comparator
413, 414, 415 NMOSFET
420 driver chip
421 logic circuit
421*a* logic block
421*b* pulse receiver
421*c* logic block
421*d* AND gate
421*e* oscillator
421*x* pulse receiver
422 UVLO/OVLO circuit
422*a*, 422*b* comparator
423, 424 comparator
425 PMOSFET
426 NMOSFET
427 NMOSFET (discharge switch)
430 transformer chip
a1-a8 pad (corresponding to first current feed pad)
b1-b8 pad (corresponding to first voltage measurement pad)
b10 counter
b11 upper-limit period checker
b12 lower-limit period checker
b13 inverter
b14 AND gate
b15 counter
b16 latch
c1-c4 pad (corresponding to second current feed pad)
d1-d4 pad (corresponding to second voltage measurement pad)
e1, e2 pad
A electronic device
B self-test circuit
BUF1, BUF2 Schmitt buffer
C isolated signal transmission circuit
L1*p*, L2*p* primary coil
L1*s*, L2*s*, L3*s*, L4*s* secondary coil
SW11-SW14, SW21-SW28 switch
T21, T22, T23, T24, T25, T26 external terminal
TR1-TR5, TR11, TR12 transformer
X first direction
X21, X22, X23 internal terminal
Y second direction
Y21, Y22, Y23 wiring
Z normal direction
Z21, Z22, Z23 via
X10 vehicle
X11-X18 electronic device

The invention claimed is:
1. A signal transmission device configured to transmit a driving signal for a power transistor from a primary circuit system to a secondary circuit system while isolating between the primary and secondary circuit systems, comprising:
a first fault detection circuit configured to detect a fault in the primary circuit system;
a second fault detection circuit configured to detect a fault in the secondary circuit system;
a first signal transmission path configured to transmit a result of detection by the second fault detection circuit from the secondary circuit system to the primary circuit system while isolating between the primary and secondary circuit systems; and
a self-test circuit configured to perform a self-test on each of the first fault detection circuit and the second fault detection circuit, wherein
the first signal transmission path includes a transformer.
2. The signal transmission device according to claim 1, wherein the self-test circuit is configured to transfer data between the primary circuit system and the secondary circuit system.
3. The signal transmission device according to claim 2, wherein
the self-test circuit includes a second signal transmission path configured to transmit a result of the self-test on the second fault detection circuit from the secondary circuit system to the primary circuit system while isolating between the primary and secondary circuit systems.
4. The signal transmission device according to claim 3, wherein
when
a self-test instruction transmission period from the primary circuit system to the secondary circuit system is represented by Ta,
a self-test period with respect to the second fault detection circuit is represented by Te,
a protection retention period after cancellation of fault detection in the secondary circuit system is represented by Tf, and
a total self-test period is represented by Tg,
then a maximum value of Ta+Te+Tf is less than a minimum value of Tg.
5. The signal transmission device according to claim 4, wherein
when
a self-test instruction transmission period from the primary circuit system to the secondary circuit system is represented by Ta,
a fault detection masking period Tb of the second fault detection circuit is represented by Tb,
a self-test result transmission period from the secondary circuit system to the primary circuit system is represented by Tc, and
a self-test period with respect to the first fault detection circuit is represented by Td,
then a maximum value of Ta+Tb+Tc is less than a minimum value of Td.
6. The signal transmission device according to claim 5, wherein
when
a fault detection masking period Tb of the second fault detection circuit is represented by Tb, and
a self-test period with respect to the second fault detection circuit is represented by Te,
then a maximum value of Tb is less than a minimum value of Te.

7. The signal transmission device according to claim 6, wherein
the self-test circuit is configured to transmit a self-test instruction from the primary circuit system to the secondary circuit system by driving an off signal for the power transistor with a number of pulses different than in ordinary operation.

8. The signal transmission device according to claim 7, wherein
the self-test circuit is configured to transmit a self-test instruction from the primary circuit system to the secondary circuit system by driving an off signal for the power transistor with a pulse period different than in ordinary operation.

9. The signal transmission device according to claim 8, wherein
a first chip having integrated therein circuit elements of the primary circuit system,
a second chip having integrated therein circuit elements of the secondary circuit system, and
a third chip having integrated therein an isolating element configured to isolate between the primary and secondary circuit systems
are sealed in a single package.

10. An electronic device comprising:
a power transistor; and
a gate driver IC configured to drive a gate of the power transistor,
wherein the gate driver IC is the signal transmission device according to claim 9.

11. A vehicle comprising the electronic device according to claim 10.

12. The signal transmission device according to claim 1, wherein
the self-test circuit includes a second signal transmission path configured to transmit a result of the self-test on the second fault detection circuit from the secondary circuit system to the primary circuit system while isolating between the primary and secondary circuit systems.

13. The signal transmission device according to claim 1, wherein
when
a self-test instruction transmission period from the primary circuit system to the secondary circuit system is represented by Ta,
a self-test period with respect to the second fault detection circuit is represented by Te,
a protection retention period after cancellation of fault detection in the secondary circuit system is represented by Tf, and
a total self-test period is represented by Tg,
then a maximum value of Ta+Te+Tf is less than a minimum value of Tg.

14. The signal transmission device according to claim 1, wherein
when
a self-test instruction transmission period from the primary circuit system to the secondary circuit system is represented by Ta,
a fault detection masking period Tb of the second fault detection circuit is represented by Tb,
a self-test result transmission period from the secondary circuit system to the primary circuit system is represented by Tc, and
a self-test period with respect to the first fault detection circuit is represented by Td,
then a maximum value of Ta+Tb+Tc is less than a minimum value of Td.

15. The signal transmission device according to claim 1, wherein
when
a fault detection masking period Tb of the second fault detection circuit is represented by Tb, and
a self-test period with respect to the second fault detection circuit is represented by Te,
then a maximum value of Tb is less than a minimum value of Te.

16. The signal transmission device according to claim 1, wherein
the self-test circuit is configured to transmit a self-test instruction from the primary circuit system to the secondary circuit system by driving an off signal for the power transistor with a number of pulses different than in ordinary operation.

17. The signal transmission device according to claim 1, wherein
the self-test circuit is configured to transmit a self-test instruction from the primary circuit system to the secondary circuit system by driving an off signal for the power transistor with a pulse period different than in ordinary operation.

18. The signal transmission device according to claim 1, wherein
a first chip having integrated therein circuit elements of the primary circuit system,
a second chip having integrated therein circuit elements of the secondary circuit system, and
a third chip having integrated therein an isolating element configured to isolate between the primary and secondary circuit systems
are sealed in a single package.

19. An electronic device comprising:
a power transistor; and
a gate driver IC configured to drive a gate of the power transistor,
wherein the gate driver IC is the signal transmission device according to claim 1.

20. A vehicle comprising the electronic device according to claim 19.

* * * * *